US009129699B2

(12) United States Patent
Suzuki et al.

(10) Patent No.: US 9,129,699 B2
(45) Date of Patent: Sep. 8, 2015

(54) SEMICONDUCTOR STORAGE APPARATUS AND METHOD INCLUDING EXECUTING REFRESH IN A FLASH MEMORY BASED ON A RELIABILITY PERIOD USING DEGREE OF DETERIORATION AND READ FREQUENCY

(75) Inventors: Akifumi Suzuki, Nakai (JP); Takashi Tsunehiro, Ebina (JP)

(73) Assignee: Hitachi, Ltd., Tokyo (JP)

( * ) Notice: Subject to any disclaimer, the term of this patent is extended or adjusted under 35 U.S.C. 154(b) by 575 days.

(21) Appl. No.: 13/130,274

(22) PCT Filed: Apr. 28, 2011

(86) PCT No.: PCT/JP2011/002507
§ 371 (c)(1),
(2), (4) Date: Aug. 22, 2011

(87) PCT Pub. No.: WO2012/147136
PCT Pub. Date: Nov. 1, 2012

(65) Prior Publication Data
US 2012/0278533 A1 Nov. 1, 2012

(51) Int. Cl.
*G11C 16/34* (2006.01)
*G06F 12/02* (2006.01)
(52) U.S. Cl.
CPC ........ *G11C 16/3418* (2013.01); *G06F 12/0246* (2013.01); *G11C 16/3404* (2013.01); *G11C 16/3495* (2013.01); *G06F 2212/72* (2013.01)
(58) Field of Classification Search
CPC ............ G06F 12/0246; G06F 2212/72; G06F 16/3431; G06F 16/3495; G11C 16/3404; G11C 16/3418
USPC .................................................... 365/185.25
See application file for complete search history.

(56) References Cited

U.S. PATENT DOCUMENTS 7,325,090 B2    1/2008  Ronen
2004/0257888 A1  12/2004  Noguchi et al.
(Continued)

FOREIGN PATENT DOCUMENTS

EP    2 077 559 A2    7/2009
JP    2008-139927 A    6/2008
(Continued)

OTHER PUBLICATIONS

PCT International Search Report and Written Opinion on application No. PCT/JP2011/002507 dated Aug. 16, 2011; 10 pages.

*Primary Examiner* — Sanjiv Shah
*Assistant Examiner* — Glenn Gossage
(74) *Attorney, Agent, or Firm* — Foley & Lardner LLP

(57) ABSTRACT

A semiconductor storage apparatus comprises a memory controller and flash memories which include a plurality of blocks as storage areas. The memory controller is configured to manage a degree of deterioration and read frequency for each of the plurality of blocks. A reliability maintained period is calculated for each storage area based on the degree of deterioration and read frequency for each storage area of a flash memory, and refresh is executed on each storage area in a planned manner based on the calculated reliability maintained period by newly storing the data stored in a block in another block based on an obtained reliability maintained period. The memory controller may also be configured to execute verification on each block and, if the number of failure bits is larger than a predetermined threshold, execute refresh to store data which is stored in a verification target block in another block.

8 Claims, 24 Drawing Sheets

(56) References Cited

U.S. PATENT DOCUMENTS

2008/0181018 A1     7/2008    Nagadomi et al.
2008/0301525 A1*   12/2008   Hirose et al. .................. 714/763
2009/0172267 A1*    7/2009    Oribe et al. ................... 711/103
2009/0248964 A1    10/2009   Yano et al.
2010/0165689 A1     7/2010    Rotbard et al.
2010/0313084 A1*   12/2010   Hida et al. .................... 714/704
2010/0332943 A1*   12/2010   D'Abreu et al. .............. 714/763

FOREIGN PATENT DOCUMENTS

| | | |
|---|---|---|
| JP | 2008-287404 A | 11/2008 |
| JP | 2009-205578 A | 9/2009 |
| JP | 2009-223876 A | 10/2009 |

* cited by examiner

FIG. 5

| 501 | 502 | 503 | 504 | 505 | 506 | 507 |
|---|---|---|---|---|---|---|
| BLOCK NUMBER | DATA RECORDING DATE AND TIME | NUMBER OF TIMES OF READING | NUMBER OF TIMES OF DELETION | DEGREE OF DETERIORATION | AVERAGE NUMBER OF TIMES OF READING PER DAY | RELIABILITY MAINTAINED PERIOD |
| 1 | 2010/08/20 | 5K TIMES | 1983 TIMES | 3500 | 0K TIMES | 80 DAYS |
| 2 | 2010/08/25 | 10K TIMES | 1004 TIMES | 2000 | 1K TIMES | 50 DAYS |
| 3 | — | — | 100 TIMES | 100 | — | — |
| 4 | 2010/08/10 | 5K TIMES | 3550 TIMES | 3500 | 10K TIMES | 30 DAYS |
| ~ | ~ | ~ | ~ | ~ | ~ | ~ |
| N | YYYY/MM/DD | N TIMES | N TIMES | N | N TIMES | N DAYS |

| DEGREE OF DETERIO-RATION | AVERAGE NUMBER OF TIMES OF READING PER DAY | | | | | |
|---|---|---|---|---|---|---|
| | 1K | 10K | 20K | ~ | 100K |
| 100 | 300 DAYS | 280 DAYS | 200 DAYS | ~ | 30 DAYS |
| 500 | 250 DAYS | 240 DAYS | 180 DAYS | ~ | 25 DAYS |
| 1000 | 100 DAYS | 95 DAYS | 80 DAYS | ~ | 10 DAYS |
| 2000 | 50 DAYS | 48 DAYS | 30 DAYS | ~ | 5 DAYS |
| ~ | ~ | ~ | ~ | ~ | ~ |
| 30000 | 10 DAYS | 6 DAYS | 3 DAYS | ~ | 0 DAYS |

FIG. 7

| REFRESH DATE AND TIME | NUMBER OF REFRESH TARGET BLOCKS | REFRESH TARGET BLOCK NUMBER | | | | |
|---|---|---|---|---|---|---|
| 2010/09/10 | 0 | | | | | ∼ |
| 2010/09/11 | 41241 | 32449 | 8742 | 2 | | ∼ |
| 2010/09/12 | 2 | 164 | 4420 | | | ∼ |
| 2010/09/13 | 13694 | 1065 | 1066 | 1067 | | ∼ |
| ∼ | ∼ | ∼ | ∼ | ∼ | ∼ | ∼ |
| YYYY/MM/DD | N | N | N | N | N | ∼ |

FIG. 11

| VERIFICATION DATE AND TIME | NUMBER OF VERIFICATION TARGET BLOCKS | VERIFICATION TARGET BLOCK NUMBER | | | | | |
|---|---|---|---|---|---|---|---|
| 2010/08/20 | 1 | 5216 | | | | | |
| 2010/08/21 | 21241 | 32449 | 8742 | 2 | ~ | ~ | 698 |
| 2010/08/22 | 1692 | 164 | 4420 | 424 | ~ | ~ | |
| 2010/08/23 | 12694 | 1065 | 1066 | 1067 | ~ | ~ | 3369 |
| ~ | ~ | ~ | ~ | ~ | ~ | ~ | ~ |
| YYYY/MM/DD | N | N | N | N | N | ~ | N |

FIG. 19

| RELIABILITY RANK = ELAPSED DATE AND TIME SINCE RECORDING DATA/RELIABILITY MAINTAINED PERIOD | ALLOWABLE NUMBER OF BLOCKS (PERCENTAGE) | NUMBER OF EXISTING BLOCKS (PERCENTAGE) | BLOCK NUMBER | | | |
|---|---|---|---|---|---|---|
| 0%-4% | NOT SPECIFIED | 10322 (14%) | 124 | 1004 | 5348 | ∼ |
| 5%-29% | 29491 (40%) | 16957 (23%) | 65 | 1395 | 6354 | ∼ |
| 30%-59% | 22118 (30%) | 21381 (29%) | 49541 | 21578 | 21579 | ∼ |
| 60%-89% | 14745 (20%) | 18432 (25%) | 38754 | 2444 | 68221 | ∼ |
| 95%-99% | 7372 (10%) | 6636 (9%) | 42314 | 20 | 21 | ∼ |

1201  1202  1203  1204  1200

SEMICONDUCTOR STORAGE APPARATUS AND METHOD INCLUDING EXECUTING REFRESH IN A FLASH MEMORY BASED ON A RELIABILITY PERIOD USING DEGREE OF DETERIORATION AND READ FREQUENCY

TECHNICAL FIELD

The present invention relates to a semiconductor storage apparatus and a method for controlling the semiconductor storage apparatus and is specifically suited for use in a semiconductor storage apparatus, whose storage media is a flash memory, a type of electrically rewritable non-volatile memory, and a method for controlling such a semiconductor storage apparatus.

BACKGROUND ART

A flash memory has the property (retention property) that data stored in the flash memory gradually changes according to elapsed time since storage of the data; and also has the property (read disturb property) that as data is read more than once, the read data gradually changes. Therefore, the semiconductor storage apparatus equipped with a flash memory as storage media generally adds an ECC (Error Correcting Code), which has the ability to correct a plurality of bits, to data when writing the data, and stores it in the storage area of the flash memory. Consequently, failure bits which changed from original data can be corrected by using this ECC when reading data. As a result, the semiconductor storage apparatus can realize accurate data retention.

Under the above-described circumstance, if a data retaining period is long in the semiconductor storage apparatus, or if data in a specific area is read locally more than once, or if these conditions are combined, failure bits might occur beyond the ECC correction ability. In this case, the reliability of data stored by the semiconductor storage apparatus will degrade and not be maintained. Conventionally, in order to deal with this type of ECC correction disability failure and maintain a sufficiently low probability of occurrence of this ECC correction disability failure, there is a method of reading data, which is already stored in a flash memory, once before the number of failure bits which have changed from the original data exceeds the number of bits which can be corrected by the ECC, correcting the failure bits of the read data by the ECC, and then storing the corrected data to another storage area in the flash memory again. This operation of storing the already stored data again for the purpose of correcting the failure bits is called refresh.

It is necessary to execute refresh according to an increase of the number of failure bits in order to prevent the ECC correction disability failure appropriately. Specifically speaking, it is necessary to execute refresh before the number of failure bits increases and exceeds the number of bits which can be corrected by the ECC.

For example, since the number of failure bits caused by read disturb changes depending on the cumulative number of times data is read from a specific storage area, it is desirable that refresh should be executed in accordance with read frequency.

Therefore, Patent Literature 1 discloses the technology of counting the number of times of reading when reading data from a flash memory; reading stored data once and checking the number of failure bits if the number of times of reading reaches a certain value; and executing refresh if the number of failure bits is equal to or larger than a previously specified number.

Furthermore, since the number of failure bits caused by the retention property changes depending on the elapsed time since storage of data, it is desirable that refresh should be executed in accordance with the elapsed time since storage of data.

Therefore, Patent Literature 2 discloses the technology of storing data in a flash memory, then counting the elapsed time since storage of the data, and executing refresh if the elapsed time exceeds a previously specified period of time.

Furthermore, the number of failure bits also tends to change depending on the degree of deterioration of a storage area; for example, the number of failure bits tends to increase in a storage area whose degree of deterioration is high as compared to a storage area whose degree of deterioration is low even if the read frequency is low and the elapsed time since storage of the data is short.

Therefore, Patent Literature 3 discloses the technology of predicting the number of failure bits in the future by considering the degree of deterioration of a storage area in a flash memory; and if it is determined that it will be impossible to maintain the reliability in the future, that is, if it is determined that the number of failure bits will exceed the number of bits that can be corrected by the ECC, restoring a data retaining property by copying the stored data to another storage area and making the copy source storage area unavailable for a certain period of time.

CITATION LIST

Patent Literature

PTL 1: US Patent Publication No. 2004-0257888
PTL 2: U.S. Pat. No. 7,325,090
PTL 3: US Patent Publication No. 2010-0165689

SUMMARY OF INVENTION

Technical Problem

Since the degree of deterioration of the flash memory depends on, for example, the cumulative number of times of deletion of each storage area and the cumulative number of times of deletion varies for different storage areas, it is obvious that the degree of deterioration is not the same in all the areas. Furthermore, even if the technology of leveling the number of times of deletion (wear leveling) is appropriately performed, it is difficult to level the tendency of increasing failure bits in all the storage areas of the flash memory due to the difference of quality occurring in production process of flash memory, slight difference of the environmental temperature, data, and other various types of factors. In consideration of the above, it can be said that a period of time for which data can be stored while maintaining high reliability (hereinafter referred to as a reliability maintained period) varies for each storage area of the flash memory.

Therefore, if a period of time after data is stored in the flash memory until refresh is executed (hereinafter referred to as the refresh period) is uniformly specified regardless of the degree of deterioration of each storage area, it is impossible to store data in a storage area whose degree of deterioration is high and which is determined to be incapable of maintaining reliability during the refresh period. The semiconductor storage apparatus is generally configured by including a certain amount of spare area; and if it is determined that data cannot be stored, this spare area can be a substitute for the storage area; however, if the semiconductor storage apparatus runs out of the spare area, the lifetime of the apparatus is considered to have expired and it is impossible to store any more data. Therefore, in order to prolong the lifetime of the apparatus, it is necessary to shorten the refresh period of the storage area, whose degree of deterioration is high, and execute refresh frequently.

Meanwhile, if a short refresh period is uniformly specified in accordance with the storage area whose degree of deterioration is high, in order to maintain the reliability of the storage area whose degree of deterioration is high, refresh will be executed frequently also for the storage area whose degree of deterioration is low and which can retain data for a long period. Excessive refresh is not desired because it causes deterioration of the storage areas to progress and also causes degradation of processing performance for requests from the host system due to exclusive possession of internal resources (bus bandwidth, processors, direct memory access (DMA), and others) by refresh.

In order to solve the above-mentioned problems, it is desirable that an optimum refresh period should be specified based on the degrees of deterioration, elapsed time since storage of data, and read frequency of each of the storage areas in the flash memory and refresh should be executed in accordance with the then specified refresh period. As explained above, it becomes possible to maintain the reliability of data stored in the semiconductor storage apparatus and realize a longer lifetime of the apparatus by performing minimum requisite refresh.

However, by the technology described in Patent Literature 1, refresh is performed based only on the read frequency and cannot be performed based on the degree of deterioration or the elapsed time. Furthermore, refresh cannot be performed by counting the read frequency for each storage area.

Furthermore, by the technology described in Patent Literature 2, refresh is performed based only on the elapsed time and cannot be performed based on the degree of deterioration and the read frequency. Furthermore, refresh cannot be performed by counting the elapsed time for each storage area.

Furthermore, by the technology described in Patent Literature 3, data is copied to another storage area immediately when it is determined that it will be impossible to maintain the reliability in the future; and refresh will be performed even though data can be stored and high reliability can be maintained for a few days after it is determined that it will be impossible to maintain the reliability. Therefore, unnecessary refresh causes the deterioration of data to progress and also deteriorates the performance of the semiconductor storage apparatus. Furthermore, refresh cannot be performed based on the degree of deterioration, the elapsed time, and the read frequency of each storage area.

Therefore, if the reliability maintained period is calculated for each storage area based on the degree of deterioration, the elapsed time, and the read frequency of each storage area in the flash memory and refresh can be performed in a planned manner for each storage area by using the calculated reliability maintained period, it is assumed possible to maintain the reliability of data, prevent the deterioration of the performance of the apparatus, and realize the longer lifetime of the apparatus.

The present invention was devised in view of the above-described circumstances and aims at suggesting a semiconductor storage apparatus and its control method capable of maintaining the reliability of data, preventing the deterioration of the performance of the apparatus, and realizing the longer lifetime of the apparatus.

Solution to Problem

In order to solve such problems, a semiconductor storage apparatus according to the present invention, including a flash memory for providing a storage area and a memory controller for controlling reading/writing of data from/to the flash memory is characterized in that the storage area of the flash memory is managed by being divided into a plurality of blocks, and the memory controller manages, for each of the blocks, a degree of deterioration and read frequency of the relevant block, obtains a reliability maintained period of data stored in the block based on the managed degree of deterioration and read frequency of the block, and performs refresh for newly storing the data, which is stored in the block, in another block based on the obtained reliability maintained period.

Furthermore, according to the present invention, a method for controlling a semiconductor storage apparatus including a flash memory for providing a storage area and a memory controller for controlling reading/writing of data from/to the flash memory is characterized in that the storage area of the flash memory is managed by being divided into a plurality of blocks; and the semiconductor storage apparatus control method includes: a first step executed by the memory controller of managing a degree of deterioration and read frequency of each block of the plurality of blocks; a second step executed by the memory controller of obtaining a reliability maintained period of data stored in the block based on the managed degree of deterioration and read frequency of the block; and a third step executed by the memory controller of performing refresh for newly storing the data, which is stored in the block, in another block based on the obtained reliability maintained period.

Advantageous Effects of Invention

According to the present invention, it is possible to maintain the reliability of data, prevent the deterioration of the performance of the apparatus, and realize the longer lifetime of the apparatus.

BRIEF DESCRIPTION OF DRAWINGS

FIG. 5 is a conceptual diagram of data retaining period management information according to Embodiment 1.

FIG. 6 is a conceptual diagram of a reliability maintained period table according to Embodiment 1.

FIG. 7 is a conceptual diagram of refresh management information according to Embodiment 1.

FIG. 11 is a conceptual diagram of verification management information Embodiment 2.

FIG. 19 is a conceptual diagram of reliability rank management information according to Embodiment 3.

DESCRIPTION OF EMBODIMENTS

An embodiment of the present invention will be explained in detail below with reference to the attached drawings.

Embodiment 1

(1-1) Configuration of Semiconductor Storage Apparatus

Figure 1:
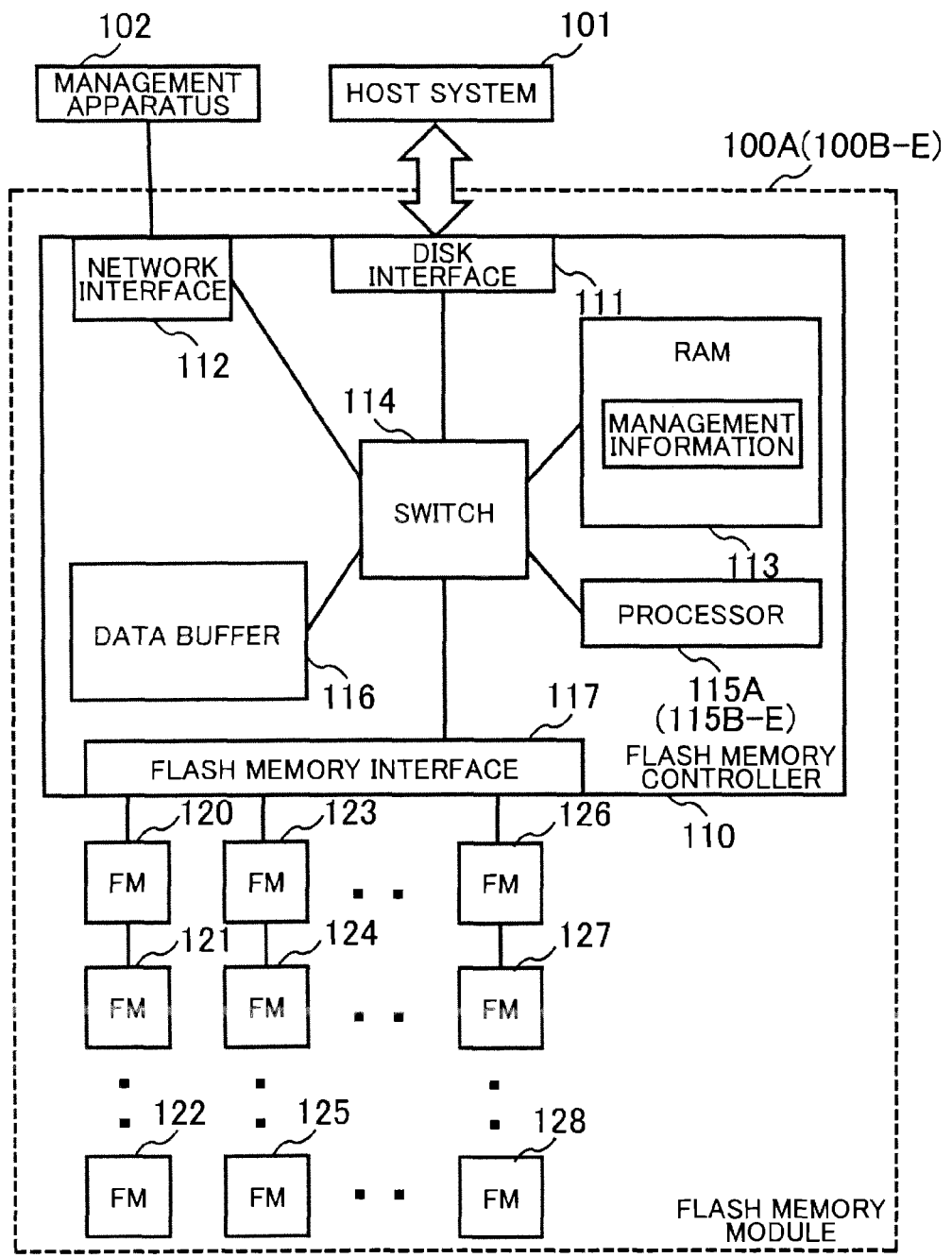
FIG. 1 is a schematic configuration diagram of a semiconductor storage apparatus.

FIG. 1 shows a schematic configuration of a semiconductor storage apparatus 100A according to this embodiment as a whole. This semiconductor storage apparatus 100A is connected to a host system 101 and a management apparatus 102 so that they can communicate with each other.

The semiconductor storage apparatus 100A includes a flash memory controller 110 and a plurality of flash memories 120 to 128 (e.g. 32 units), and the flash memory controller 110 includes a disk interface 111, a network interface 112, a RAM (Random Access Memory) 113, a switch 114, a processor 115A, a data buffer 116, and a flash memory interface 117.

The disk interface 111 is connected to a storage apparatus or the host system 101 such as a server and is connected to the respective units in the flash memory controller 110 via the switch 114. The disk interface 111 receives read/write requests, LBAs (Logical Block Addresses) specifying the logical storage locations of request targets, and write data at the time of write requests from the host system 101. Furthermore, when receiving a control command of the semiconductor storage apparatus 100A, the disk interface 111 notifies, for example, the host system of the operational status, the usage status and current set values of the semiconductor storage apparatus 100A in accordance with the received command.

The network interface 112 receives various types of information from the management apparatus 102 or transmits various types of information to the management apparatus 102.

Specifically, the RAM 113 is composed of volatile memory such as a DRAM (Dynamic RAM) and this RAM 113 stores, for example, various types of programs for controlling the operation of the flash memory controller 110, management information of the flash memories 120 to 128, and a transfer list including transfer control information to be used by each DMA. It should be noted that the RAM 113 may also include a part of or all of functions of the data buffer 116 for storing data.

The switch 114 connects the disk interface 111, the network interface 112, the RAM 113, the processor 115A, the data buffer 116, and the flash memory interface 117 in the flash memory controller 110, routes and transfers data between the respective components by using addresses or IDs.

The processor 115A is connected to the respective components of the flash memory controller 110 via the switch 114 and performs integrated control of the entire flash memory controller 110 in accordance with the various types of programs and the management information stored in the RAM 113. Furthermore, the processor 115A monitors the entire flash memory controller 110 by regular information acquisition and an interrupt reception function.

The data buffer 116 stores temporary data in process of data transfer processing in the flash memory controller 110.

The flash memory interface 117 is connected to the plurality of flash memories 120 to 128 via a plurality of buses (e.g. 16 buses). The plurality of flash memories (e.g. two flash memories) are connected to each bus, and the flash memory interface 117 independently controls the plurality of flash memories connected to the same bus by using a CE (Chip Enable) signal. Furthermore, the flash memory interface 117 operates in accordance with a read/write request from the processor 115A. Under this circumstance, the flash memory interface 117 receives a request target, using a physical block address (PBA). The flash memory interface 117 calculates the flash memories 120 to 128, blocks, and pages by using the PBAs, and executes the read/write request, which specifies the blocks and pages, on the request target flash memory.

Furthermore, the flash memory interface 117 reads the stored data from the flash memories 120 to 128 when reading the data; and transfers the read data to the data buffer 116. Meanwhile, when writing data, the flash memory interface 117 reads write data from the data buffer 116 and writes the read data to the flash memories 120 to 128.

Furthermore, the flash memory interface 117 includes an ECC generation circuit, a data loss detection circuit by means of the ECC, and an ECC correction circuit; and when writing data, the flash memory interface 117 adds an ECC to the data by using the ECC generation circuit and writes the data. Meanwhile, when reading data, the flash memory interface 117 checks the read data from the flash memories 120 to 128 by using the data loss detection circuit by means of the ECC. Furthermore, if data loss is detected, the flash memory interface 117 performs data correction by using the ECC correction circuit, and stores the number of corrected bits in the RAM 113.

The host system 101 is, for example, a computer or a file server which serves as the core of a business system, or a storage apparatus to which a large number of semiconductor storage apparatuses are connected. The host system 101 includes hardware resources such as a processor, a memory, a network interface, and local input/output devices which are not shown in the drawing; and includes software resources such as a device driver, an operating system (OS) and application programs. The host system 101 communicates with the semiconductor storage apparatus 100A and makes data read/write requests by executing various types of programs under control of the processor. Furthermore, the host system 101 obtains the management information such as the use status and operational status of the semiconductor storage apparatus 100A by executing a management program under control of the processor. Furthermore, the host system 101 can designate or change a management unit of the semiconductor storage apparatus 100A, a method for controlling the semiconductor storage apparatus 100A, and the reliability of requested data.

Figure 18:
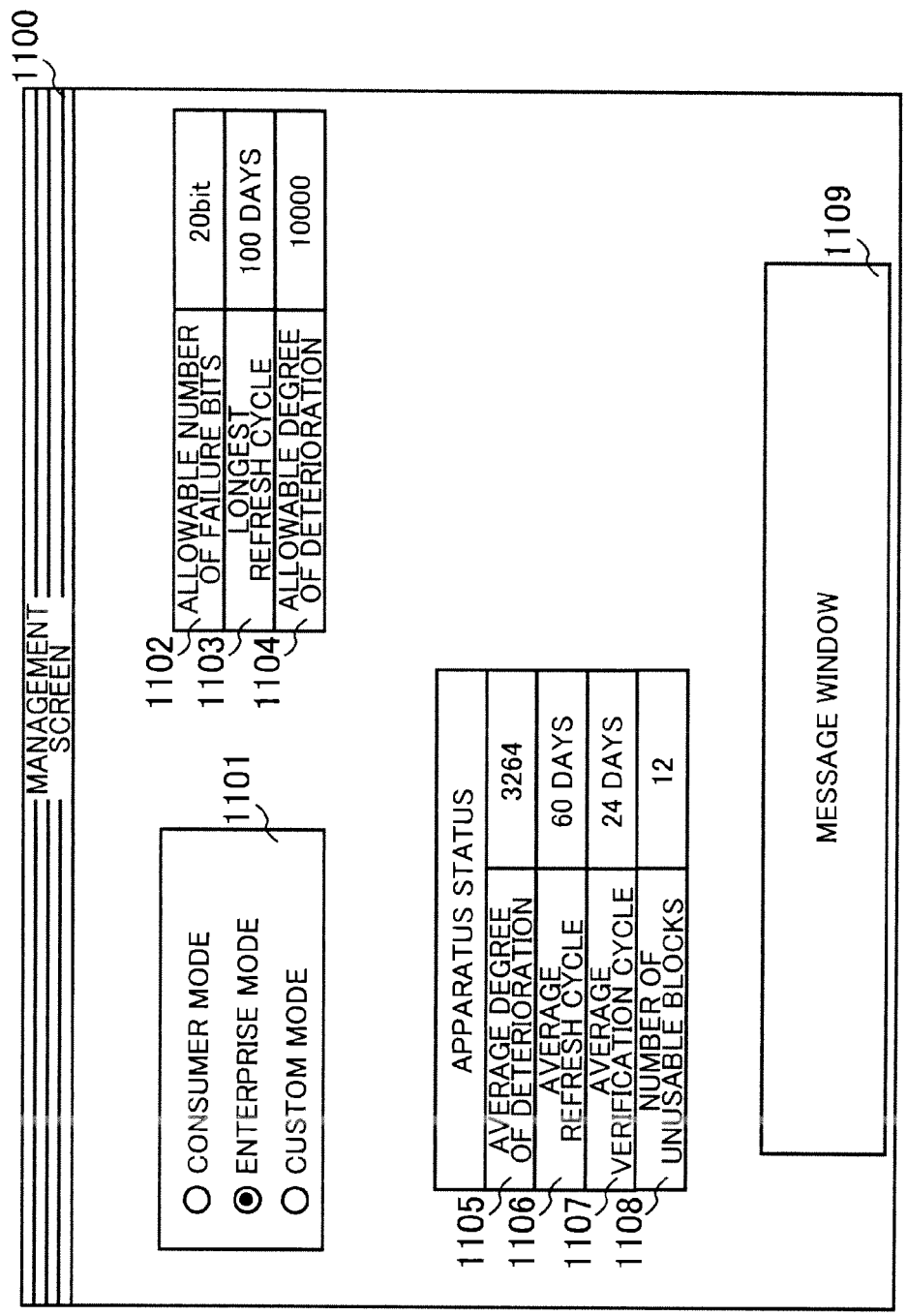
FIG. 18 is a configuration diagram of a management screen according to Embodiment 2.

The management apparatus 102 is a computer equipped with hardware resources such as a processor, a memory, a network interface and local input/output devices, which are not shown in the drawing, and software resources such as a management program which is not shown in the figure. The management apparatus 102 obtains information from the storage apparatus by the program and displays, for example, a management screen as shown in FIG. 18 described later. A system administrator controls monitoring and operation of the semiconductor storage apparatus 100A by using the management screen displayed on the management apparatus 102. It should be noted that the management apparatus 102 may be the same apparatus as the above-mentioned host system 101 and may also be a different apparatus dedicated for management.

It should be noted that the disk interface 111, the network interface 112, the RAM 113, the switch 114, the processor 115A, the data buffer 116, and the flash memory interface 117 which are explained above may be configured in one semiconductor device by means of ASIC (Application Specific Integrated Circuit) or FPGA (Field Programmable Gate Array) and may also be configured by mutually connecting a plurality of individual dedicated ICs (Integrated Circuits).

(1-2) Data Configuration

Figure 2:
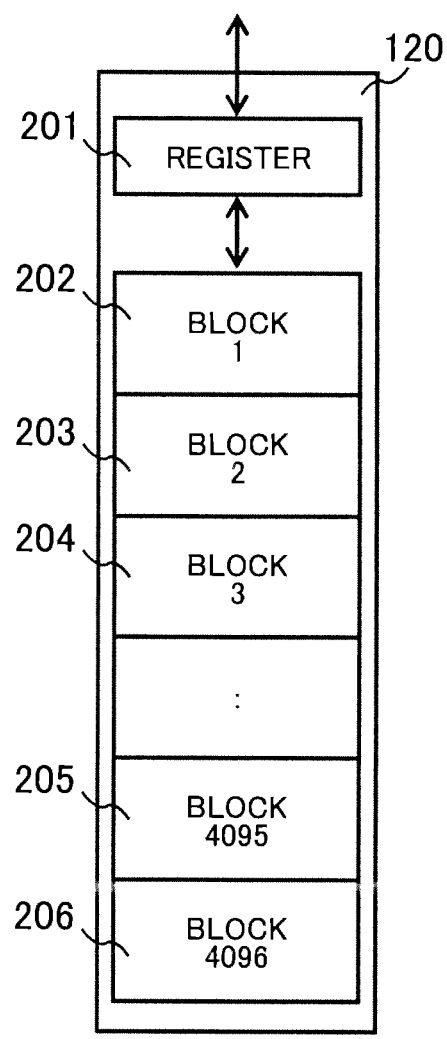
FIG. 2 is an internal configuration diagram of a flash memory.

FIG. 2 shows the internal configuration of the flash memory 120. The flash memory 120 is constituted from a register 201 and a plurality of blocks 202 to 206 (e.g. 4096 blocks). It should be noted that other flash memories 121 to 128 also have the same configuration as that of the flash memory 120.

The register 201 is a register comprising the storage capacity of a page size (e.g. 4 KB) or larger, and the blocks 202 to 206 are data storage areas. In the flash memory 120, the data can be deleted only in units of blocks.

The flash memory 120 operates in accordance with instructions of read/write requests from the flash memory interface 117. When writing data, the flash memory 120 firstly receives a write command, request target blocks, and page numbers from the flash memory interface 117, and then stores write data, which is transferred from the flash memory interface 117, in the register 201. Subsequently, the flash memory 120 writes the data stored in the register 201 to the specified pages. Meanwhile, when reading data, the flash memory 120 firstly receives a read command, request target blocks, and page numbers from the flash memory interface 117, and then reads the data stored in the specified pages, and stores it in the register 201. Subsequently, the flash memory 120 transfers the data stored in the register 201 to the flash memory interface 117.

Figure 3:
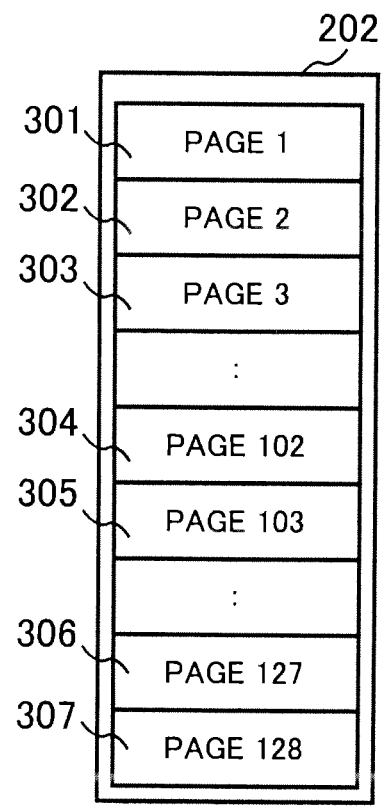
FIG. 3 is an internal configuration diagram of a block.

FIG. 3 shows the internal configuration of a block 202. The block 202 is composed of a plurality of pages 301 to 307 (e.g. 128 pages). It should be noted that other blocks 203 to 206 also have the same configuration as that of the block 202.

Each page 301 to 307 is a minimum data storage area. The flash memory 120 performs data reading/writing on a page unit. The order of writing data to the pages 301 to 307 is specified in advance, and the flash memory 120 writes data in order of 301, 302, 303, and so on until 307. Furthermore, overwriting in a page where data is already stored is prohibited, and no data cannot be stored in the page again until all the data stored in the block to which the page belongs is deleted. Therefore, the semiconductor storage apparatus 100A to which the present invention is applied manages logical addresses (LBAs) specified by the host system 101 and addresses specifying the physical storage locations in the semiconductor storage apparatus 100A (PBAs) in different systems, and manages table information where the LBAs and the PBAs are associated with each other. Based on this table information, even when receiving an update write request with respect to data of the same LBA from the host system 101, the flash memory 120 performs processing for converting the PBA associated with the LBA before the update into a new PBA indicating another page and writing the data to a storage area specified by the converted PBA. As a result of the above-mentioned address conversion processing, the flash memory 120 can conceal the change of the actual physical storage area from the host system 101.

Figure 4:
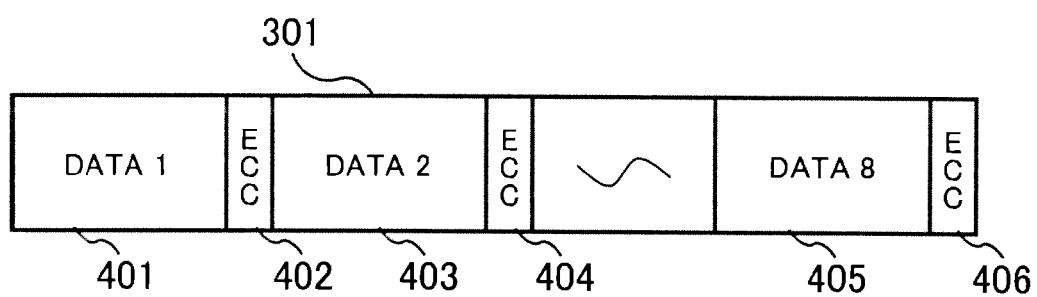
FIG. 4 is an internal configuration diagram of a page.

FIG. 4 shows the internal configuration of a page 301. The page 301 is composed of a plurality of pieces of data (e.g. 8 pieces of data) and ECCs. It should be noted that other pages 302 to 307 also have the same configuration as that of the page 301.

Each piece of data 401, 403, and 405 is composed of a certain number of bits (e.g. 4 KB), and each ECC 402, 404, 406 is stored next to the data guaranteed by the relevant code. Furthermore, as the ECC 402 is stored next to the data 401, the ECC 402 constitutes, together with the data, one ECC/CW (ECC/Code Word). In the case of FIG. 4, for example, a combination of the ECC 402 and the data 401 (Data 1) constitutes one ECC/CW (ECC/Code Word). A data loss failure occurs when the number of failure bits per ECC/CW exceeds the number of bits that can be corrected by the ECC. It should be noted that the page 301 in FIG. 4 configures eight ECC/CWs in the page, but the number of ECC/CWs configured in a page is not necessarily limited to the above-mentioned number, and an arbitrary number of ECC/CWs may be configured in accordance with page size and the ECC intensity (the number of bits that can be corrected).

(1-3) Configuration of Various Management Information

FIG. 5 shows data retaining period management information 500 from among the management information stored in the RAM 113 of the semiconductor storage apparatus 100A. The data retaining period management information 500 is information used for managing the data retaining period for each block and performing refresh for each block, and is constructed from a block number column 501, a data storage/recording date-and-time column 502, a number-of-times-of-reading column 503, a number-of-times-of-deletion column 504, a degree-of-deterioration column 505, an average number-of-times-of-reading-per-day column 506, and a reliability maintained period column 507.

The block numbers of all the blocks managed by the semiconductor storage apparatus 100A are stored in the block number column 501. It should be noted that if a plurality of flash memories installed in the semiconductor storage apparatus 100A exist as shown in FIG. 1, the numbers of the flash memories and the block numbers in the flash memories are collectively stored. Specifically speaking, a value by which a target block is uniquely identified from among all the blocks in all the flash memories installed in the semiconductor storage apparatus 100A is stored in the block number column 501.

It should be noted that the case where the value by which the target block is uniquely identified is stored in the block number column 501 is shown in FIG. 5, but a plurality of blocks having the same use condition are gathered to form one block group and a value for identifying such a block group is stored in the block number column 501. However, if the plurality of blocks are managed as a group as explained above, an increase of failure bits due to read disturb is limited within a block including a page where reading occurred; and, therefore, data reliability prediction accuracy of the block group in consideration of read disturb will deteriorate.

The date and time (date) when data is stored in the relevant block is stored in the data storage date-and-time column 502. The current date and time is always managed by the semiconductor storage apparatus 100A, and the date and time when data is written to a top page of the relevant block is stored in the data storage date-and-time column 502.

Meanwhile, a cumulative number of times data is read from the block is stored in the number-of-times-of-reading column 503. The number of times of reading is cumulatively counted each time data is read by the semiconductor storage apparatus 100A, and a count value which is counted cumulatively is stored in the number-of-times-of-reading column 503.

Furthermore, the cumulative number of times data is deleted from the relevant block is stored in the number-of-times-of-deletion column 504. The number of times of deletion is cumulatively counted each time data is deleted by the semiconductor storage apparatus 100A, and a count value which is counted cumulatively is stored in the number-of-times-of-deletion column 504.

A value indicating the degree of deterioration of the relevant block is stored in the degree of deterioration column 505. The degree of deterioration may be, for example, the above-mentioned number of times of deletion or may be a value calculated based on failure bit number distribution as explained in Embodiment 2 described later.

Furthermore, an average number of times of reading per day, that is, read frequency is stored in the average number-of-times-of-reading-per-day column 506. The average number of times of reading per day is a value calculated by the processor 115A. A data storage date and time is firstly obtained from the data storage date-and-time column 502, and elapsed time since storing the data is obtained by subtracting the obtained data storage date and time from the current date and time. Subsequently, the cumulative number of times of reading is obtained from the number-of-times-of-reading column 503, and a value calculated by dividing the obtained cumulative number of times of reading by the elapsed time is recognized as the number of times of reading per day. It should be noted that the example where the read frequency is managed on a per diem basis has been explained above; however, the invention is not limited to this example, and the read frequency may also be managed, for example, on a hourly basis or a weekly basis, and any unit basis may be permitted as long as a value indicates the frequency of reading data from a specific storage area.

Furthermore, the reliability maintained period column 507 stores a predicted period during which it is predicted that it is possible to retain data and maintain the reliability of the data after storing the data. A value stored in the reliability maintained period column 507 is obtained based on a reliability maintained period table 600 (see FIG. 6) explained later.

Therefore, in the case of FIG. 5, the table shows that, for example, regarding a block whose block number is 1, the date and time when the data is stored is 2010/08/20, the number of times data has been read from this block until present is 5000 (5K) times, and the number of times data has been deleted from this block until present is 1983 times. Furthermore, the table indicates that the degree of deterioration of this block is 3500, the average number of times of reading per day is 0 times (less than 1000 times), and the reliability maintained period of the data stored in this block is 80 days.

FIG. 6 shows the reliability maintained period table 600 from among the management information stored in the RAM 113 of the semiconductor storage apparatus 100A. The reliability maintained period table 600 is used to determine a unique reliability maintained period based on the degree of deterioration and the average number of times of reading per day. It should be noted that the determined reliability maintained period is stored in the reliability maintained period column 507 of the above-mentioned data retaining period management information 500 (see FIG. 5).

The reliability maintained period table 600 is constructed from a degree-of-deterioration column 601, an average number-of-times-of-reading-per-day column 602, and a reliability maintained period column 603.

A value indicating the degree of deterioration of the relevant block is stored in the degree-of-deterioration column 601, and an average number of times of reading per day is stored in the average number-of-times-of-reading-per-day column 602. Furthermore, a reliability maintained period which is specified in advance in accordance with the type and characteristics of the flash memory installed in the semiconductor storage apparatus 100A is stored in the reliability maintained period column 603. According to the reliability maintained period table 600, a unique reliability maintained period can be identified from the reliability maintained period column 603 by identifying one degree of deterioration from the degree-of-deterioration column 601 and identifying one number of times of reading from the average number-of-times-of-reading-per-day column 602.

Therefore, in case of FIG. 6, the table shows that regarding a block whose degree of deterioration is 2000 and whose average number of times of reading per day is 1000 times (0 times or more and less than 1000 times), a value where both the above-mentioned degree of deterioration and number of times of reading apply is 50 days, so the reliability maintained period is 50 days.

Under this circumstance, since the reliability maintained period stored in the reliability maintained period column 603 changes depending on the type and the respective characteristics of the adopted flash memory, the retention property and the read disturb property of the flash memory adopted as the storage media are measured in advance, and a value calculated by reflecting the tendency of the number of failure bits, which is the measurement result, to increase is used. For example, if 5 bits which is the average number of failure bits is set as an allowable limit number of bits in the reliability standard with the semiconductor storage apparatus 100A having the ECC correction ability of 20 bits, a period of time during which the average number of failure bits measured in the relevant block increases to 5 bits is measured for each condition of the degree of deterioration and the average number of times of reading per day in a preliminary flash memory test, and the measured period is used as the reliability maintained period.

As explained above, the reliability maintained period stored in the reliability maintained period column 603 can be determined freely in accordance with the reliability required for the data, and the reliability of data retention by the semiconductor storage apparatus 100A can be changed freely by appropriately changing the value of the reliability maintained period column 603. It should be noted that in this embodiment, the retention property and the read disturb property of the flash memory which is scheduled to be installed in the apparatus are measured in advance before activating the semiconductor storage apparatus 100A and the value of the reliability maintained period column 603 is determined based on the measurement result; however, the invention is not limited to this example, and the value of the reliability maintained period column 603 may be sequentially updated based on the number of failure bits obtained during the operation of the semiconductor storage apparatus 100A. For example, when an average value of the allowable limit number of bits of the semiconductor storage apparatus 100A is 5 bits and the number of failure bits which is 5 bits on average is detected when reading data during the reliability maintained period, a storage area whose data retaining property is worse than the tendency of the number of failure bits to increase indicated by the value determined in advance in the reliability maintained period column 603 exists, so that an update may be performed to reduce the value of the reliability maintained period column 603 and thereby shorten the reliability maintained period in order to improve the reliability.

Furthermore, an index area for calculating the reliability maintained period may be created in part of the storage area of the flash memory installed in the semiconductor storage apparatus 100A and the value of the reliability maintained period table 600 may be determined based on a value of the index area. For example, during the initial operation of the semiconductor storage apparatus 100A, a specific number of times of writing and deletion are performed for some blocks of each flash memory and a failure bit index block group which is made to deteriorate intentionally is created. Subsequently, failure bits are measured for each elapsed time from the failure bit index block group, and the value of the reliability maintained period column 603 is determined for each flash memory based on the tendency of failure bits to increase. As explained above, it is possible to deal with the differences in quality between the flash memories by referring to the tendency of failure bits to increase as obtained from the failure bit index block group of each flash memory.

Furthermore, according to this embodiment, the value obtained from the preliminary test or the test during the operation is stored in the reliability maintained period column 603; however, the invention is not necessarily limited to this example, and a value calculated according to a formula may also be stored. For example, a function with two variables whose variables are the degree of deterioration and the average number of times of reading per day may be prepared based on measured values for each condition of the degree of deterioration and the average number of times of reading per day which are measured in the preliminary flash memory test, the reliability maintained period may be calculated by using this function, and the calculated value may be stored.

Furthermore, division units of the respective items in the average number-of-times-of-reading-per-day column 602 in FIG. 6 are 1000 times, 10000 times, and 20000 times; however, the invention is not necessarily limited to this example, and the division units of the respective items may be smaller if the reliability maintained period needs to be obtained with high accuracy in the semiconductor storage apparatus 100A. Furthermore, the division units of the respective items in the degree of deterioration column may also be made smaller. The accuracy of the reliability maintained period table 600 can be changed in accordance with conditions such as the reliability required for the semiconductor storage apparatus 100A, the production process of the flash memories adopted as the storage media, SLC (Single Level Cell), MLC (Multi Level Cell), and TLC (Triple Level Cell).

It should be noted that reference is made to the average number of times of reading per day of the target block when the reliability maintained period is obtained by referring to the reliability maintained period table 600 of FIG. 6; and the actual average number of times of reading per day does not have to be completely identical to each of the values in the average number-of-times-of-reading-per-day column in FIG. 6, and it is only necessary to round off the average number of times of reading per day in accordance with each of the values as the division units in the average number-of-times-of-reading-per-day column in FIG. 6 and refer to the resultant average number of times of reading per day.

FIG. 7 shows refresh management information 700 from among the management information stored in the RAM 113 of the semiconductor storage apparatus 100A. The refresh management information 700 is used to manage scheduled dates for performing refresh and is constructed from a refresh date-and-time column 701, a number-of-refresh-target-blocks column 702, and a refresh target block number column 703.

A scheduled date and time for performing refresh in the future is stored in the refresh date-and-time column 701, the number of blocks that are refresh target blocks on which refresh will be performed is stored in the number-of-refresh-target-blocks column 702, and the block numbers of the refresh target blocks on which refresh is performed are stored in the refresh target block number column 703.

Therefore, in the case of FIG. 7, the table shows that, for example, refresh is scheduled to be performed on 2010/09/11 in the future, the number of blocks that are refresh targets on which refresh will be performed on this date and time is 41241, and the block numbers of the refresh target blocks are 32449, 8742, 2, and so on.

(1-4) Processing Sequence of Various Processing

Figure 8:
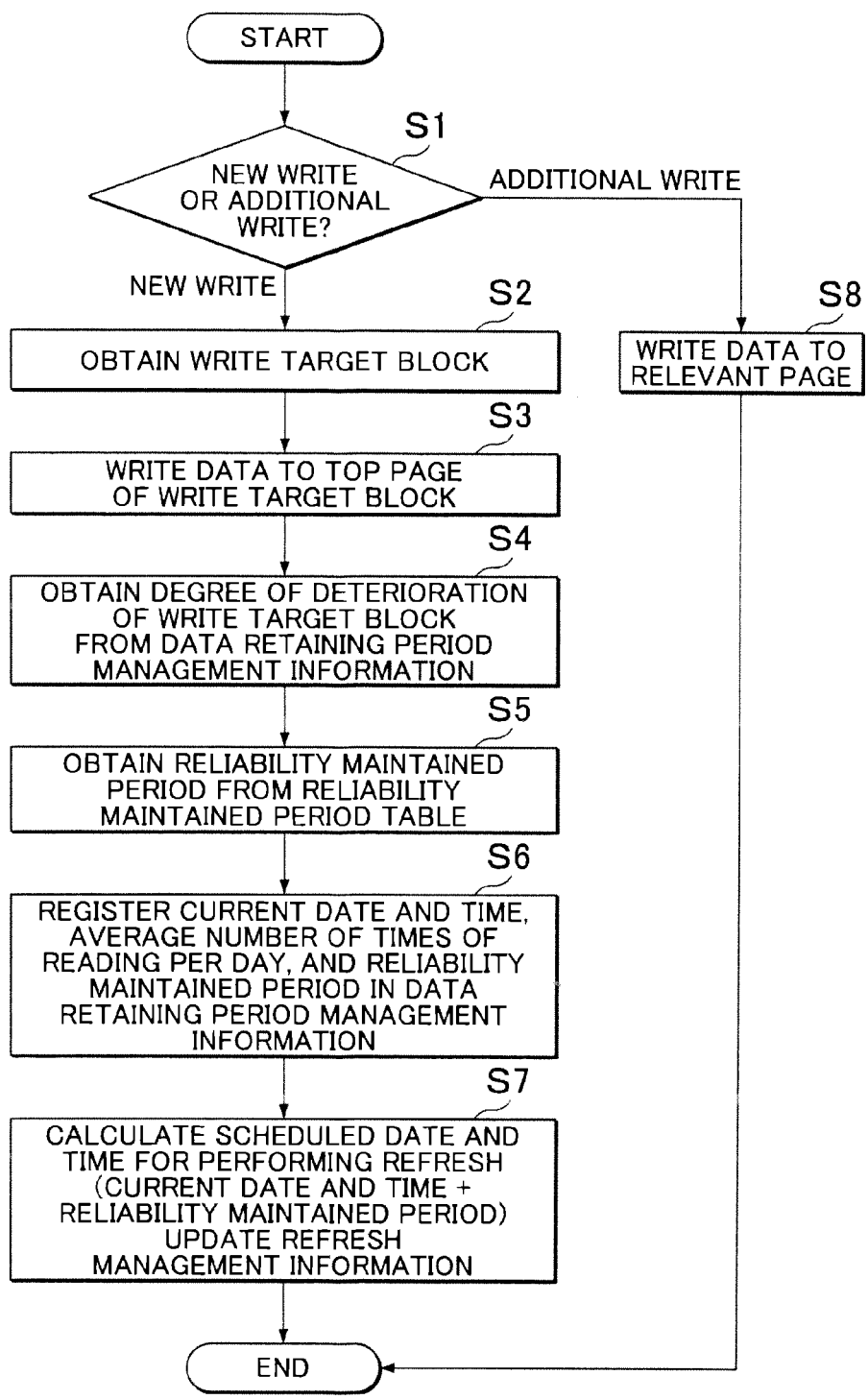
FIG. 8 is a flowchart of write processing according to Embodiment 1.

FIG. 8 shows a processing sequence of write processing performed by the processor 115A for the semiconductor storage apparatus 100A. The processor 115A starts the write processing shown in this FIG. 8 after receiving a write request including data and a write location LBA from the host system 101.

Subsequently, after starting this write processing, the processor 115A firstly judges whether the write request from the host system 101 is for the purpose of new write or additional write (S1). New write herein used means to newly store data in the blocks in a state where data is deleted; and generally means processing for writing data sequentially from the top page. Meanwhile, additional write herein used means to add and store data from a page in the middle to a block having the pages in a state where data is already stored.

If it is determined in step S1 that the write request from the host system 101 is made for the purpose of new write, the processor 115A obtains a write target block (S2). More specifically, the processor 115A obtains an arbitrary block as the write target block from a registration list of unwritten blocks (hereinafter referred to as the unwritten block pool) managed by the semiconductor storage apparatus 100A. When this happens, the processor 115A associates the write location LBA included in the write request with the PBA of the write target block obtained in step S2. Subsequently, the processor 115A will write data to a page specified by the PBA associated with the LBA.

The processor 115A writes the data from the host system 101 to the top page of the write target block obtained in step S2 (S3). Subsequently, the processor 115A sends a write completion report to the host system 101.

Next, the processor 115A refers to the data retaining period management information 500 stored in the RAM 113 and obtains the degree of deterioration of the block to which the data is written (S4).

Subsequently, the processor 115A refers to the reliability maintained period table 600 stored in the RAM 113 and obtains the reliability maintained period which is uniquely determined based on the degree of deterioration obtained in step S4 when the average number of times of reading per day is 0 times (S5). Incidentally, since the average number of times of reading per day of the block immediately after writing the data is 0 times, the reliability maintained period can be obtained based on the degree of deterioration obtained in step S4 and the average number of times of reading which is 0 times.

Subsequently, the processor 115A stores the data storage date and time, the average number of times of reading per day, and the reliability maintained period corresponding to the write target block obtained in step S2 in each of the data storage date-and-time column 502, the average number-of-times-of-reading-per-day column 506, and the reliability maintained period column 507 of the data retaining period management information 500 stored in the RAM 113 (S6). It should be noted that values before the execution of this new write processing are already stored in other columns (503 to 505).

Subsequently, the processor 115A adds the reliability maintained period obtained in step S5 to the current date and time, and calculates it as the scheduled date and time for performing refresh (S7). Subsequently, the processor 115A extracts the same date and time as the calculated scheduled date and time for performing refresh from the refresh date-and-time column 701 in the refresh management information 700, and adds one to the number of blocks in the number-of-refresh-target-blocks column 702 corresponding to the extracted date and time. Furthermore, the processor 115A stores the block number of the write target block obtained in step S2 in the refresh target block number column 703 corresponding to the extracted date and time. Furthermore, at the same time, the processor 115A subtracts one from the number of blocks in the number-of-refresh-target-blocks column 702 corresponding to the scheduled date and time, which have been scheduled, for performing refresh, and furthermore the block number of the write target block is deleted from the refresh target block number column 703. As explained above, the processor 115A updates the refresh management information 700 (S7), and then terminates the write processing.

Meanwhile, if it is determined in step S2 that the write request from the host system 101 is made for the purpose of additional write, the processor 115A writes the data included in the write request to the relevant page of the additional write target block (S8). Subsequently, the processor 115A sends a write completion report to the host system 101 and then terminates the write processing.

Figure 9:
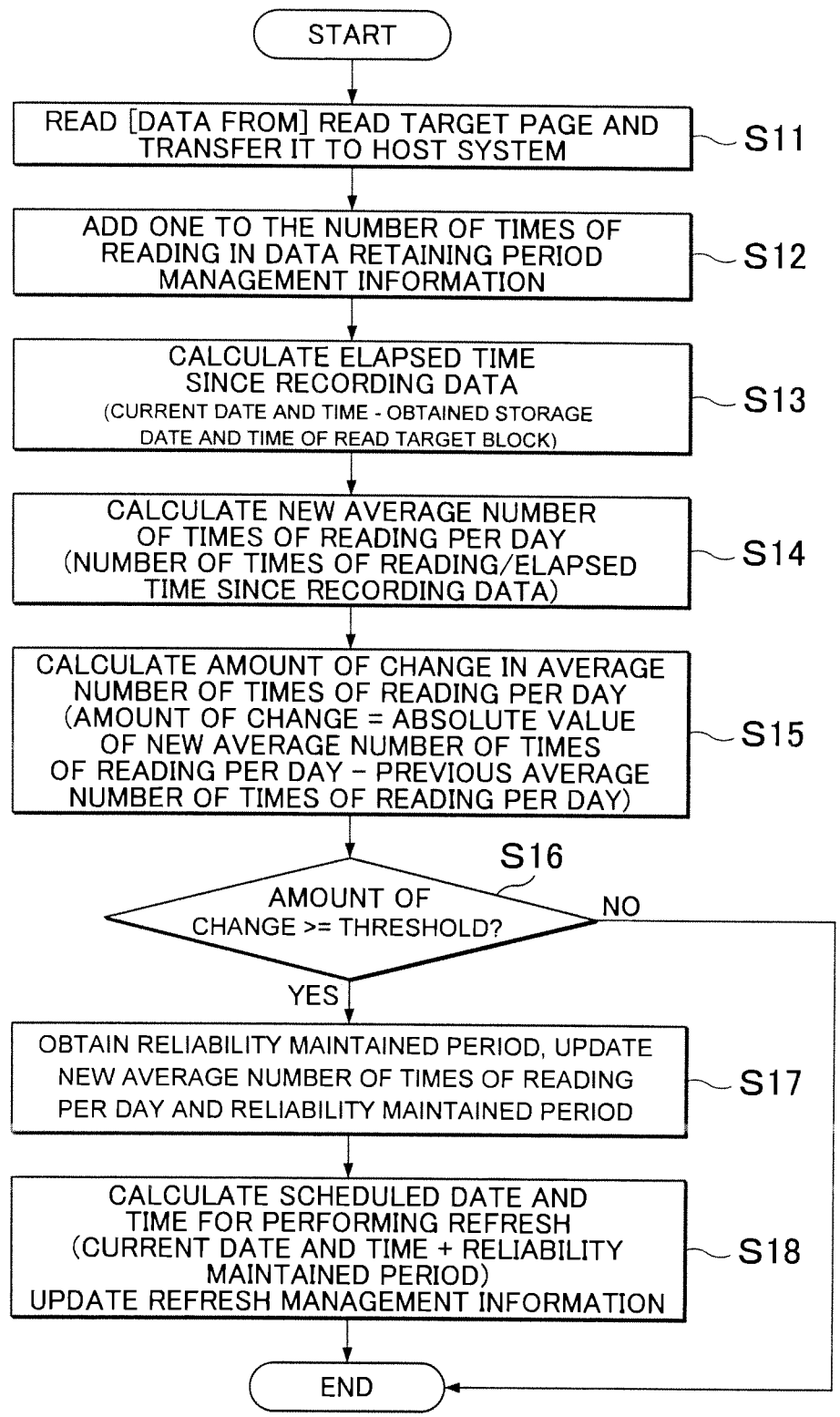
FIG. 9 is a flowchart of read processing according to Embodiment 1.

FIG. 9 shows a processing sequence of read processing executed by the processor 115A for the semiconductor storage apparatus 100A. The processor 115A starts the read processing shown in this FIG. 9 after receiving a read request including a read location LBA from the host system 101.

Firstly, the processor 115A converts the read location LBA included in the read request from the host system 101 into a PBA and reads data from a read target page specified by the converted PBA. Then, the processor 115A transfers the read data to the host system 101 (S11).

Subsequently, the processor 115A obtains the number of times of reading of the read target block from the number-of-times-of-reading column 503 of the data retaining period management information 500, adds the number of times of reading to the obtained value, then stores the number of times of reading, which is obtained as a result of the addition, in the number-of-times-of-reading column 503, and thereby updates the data retaining period management information 500 (S12).

Subsequently, the processor 115A obtains the data storage date and time of the read target block from the data storage date-and-time column 502 of the data retaining management information 500, and calculates the elapsed time since storing the data from the difference between the obtained data storage date and time and the current date and time (S13).

Subsequently, the processor 115A divides the number of times of reading updated in step S12 by the elapsed time calculated in step S13, and newly calculates the average number of times of reading per day (S14).

Subsequently, the processor 115A obtains the average number of times of reading per day of the read target block from the average number-of-times-of-reading-per-day column 506 of the data retaining period management information 500, and calculates an absolute value of the difference between the obtained average number of times of reading per day and the average number of times of reading per day which was newly calculated in step S14, as an amount of change (S15).

Subsequently, the processor 115A judges whether the amount of change calculated in step S15 is equal to or larger than a previously specified threshold or not (S16). It should be noted that the threshold used herein is a value determined based on a division unit for the average number-of-times-of-reading-per-day column 602 in the reliability maintained period table 600 (see FIG. 6). For example, in the case of FIG. 6, since the division unit for the average number-of-times-of-reading-per-day column 602 is the unit basis of 10000 times, the threshold is 10000.

If an affirmative judgment is returned in this step, the processor 115A determines that the average number of times of reading per day used to obtain the reliability maintained period changed significantly; and then proceeds to step S17.

Specifically speaking, the processor 115A refers to the reliability maintained period table 600 and obtains a new reliability maintained period by using the average number of times of reading per day, which is newly calculated in step S14, and the degree of deterioration. Subsequently, the processor 115A stores the obtained new reliability maintained period and the average number of times of reading per day which is newly calculated in step S14 in the reliability maintained period column 507 and the average number-of-times-of-reading-per-day column 506, respectively, corresponding to the read target block of the data retaining period management information 500, and thereby updates the data retaining period management information 500 (S17).

Subsequently, the processor 115A adds the new reliability maintained period obtained in step S17 to the current date and time, and calculates it as the scheduled date and time for performing refresh (S18). Subsequently, the processor 115A extracts the same date and time as the calculated scheduled date and time for performing refresh from the refresh date-and-time column 701 in the refresh management information 700, and adds one to the number of blocks stored in the number-of-refresh-target-blocks column 702 corresponding to the extracted date and time, and also stores the block number of the read target block in the refresh target block number column 703. Furthermore, at the same time, the processor 115A subtracts one from the number of blocks in the number-of-refresh-target-blocks column 702 corresponding to the scheduled date and time, which have been scheduled, for performing refresh and also deletes the block number of the read target block from the refresh target block number column 703. As explained above, the processor 115A updates the refresh management information 700 (S18) and then terminates the read processing.

Meanwhile, if a negative judgment is returned in step S16, the processor 115A determines there is no significant change in the current reliability maintained period; and then terminates the read processing without updating the refresh management information 700.

Figure 10:
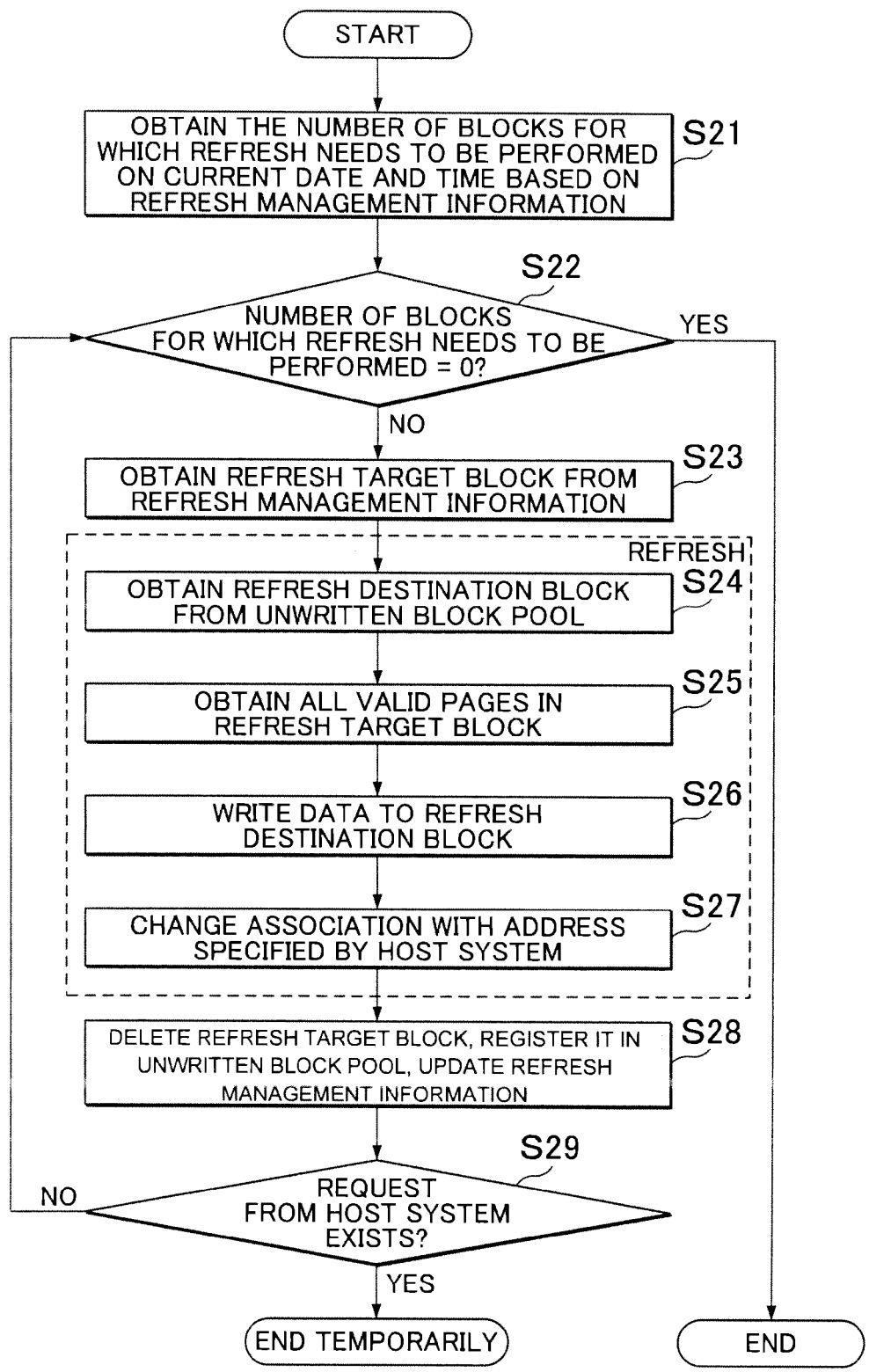
FIG. 10 is a flowchart of refresh processing according to Embodiment 1.

Meanwhile, FIG. 10 shows a processing sequence of refresh processing executed by the processor 115A in the semiconductor storage apparatus 100A. The processor 115A starts the refresh processing shown in this FIG. 10 regularly at the timing when there is no access request from the host system 101, in order to prevent the performance deterioration of the apparatus due to competition between an access request from the host system 101 and the refresh processing.

After starting this refresh processing, the processor 115A firstly extracts the same date and time as the current date and time from the refresh date-and-time column 701 in the refresh management information 700, and obtains the number of refresh target blocks corresponding to the extracted date and time from the number-of-refresh-target-blocks column 702 (S21).

Subsequently, the processor 115A judges whether the number of refresh target blocks obtained in step S21 is 0 or not (S22).

If an affirmative judgment is returned in this step, the processor 115A determines it is not necessary to perform refresh on the current date and time; and then terminates the refresh processing.

Meanwhile, if a negative judgment is returned in step S22, the processor 115A obtains one refresh target block number corresponding to the current date and time from the refresh target block number column 703 of the refresh management information 700 (S23).

Subsequently, when performing refresh, the processor 115A executes processing for copying and writing data, which is stored in the refresh target block, to another block. So, the processor 115A obtains a refresh destination block as a copy destination to be used for the above-described processing from the unwritten block pool (S24).

Subsequently, the processor 115A obtains data of all valid pages associated with the LBAs in the host system 101 from among all the pages in a refresh target block (S25). More specifically, the processor 115A corrects failure bits of the data of the refresh target block by means of the ECC function installed in the flash memory interface 117, and reads the data of the refresh target block, whose number of failure bits becomes 0, to the data buffer 116.

Subsequently, the processor 115A writes the data of the refresh target block obtained in step S25 to the refresh destination block obtained in step S24 (S26). It should be noted that the write processing in this step is the same as the aforementioned write processing (see S1 to S7). Specifically speaking, the processor 115A executes the write processing on the refresh destination block as the refresh target block, reflects this refresh destination block in the data retaining period management information 500 and the refresh management information 700, and thereby updates such management information.

Furthermore, the association with the address (LBA) specified by the host system 101 is changed. That is, the processor 115A associates the LBA of the host system 101 with the refresh destination block (S27). Because of this association, the host system 101 can access the data in the refresh destination block by using the same LBA as the LBA before performing refresh even after performing refresh.

Subsequently, the processor 115A deletes the data in the refresh target block obtained in step S23, and registers this refresh target block, whose data has been deleted, in the unwritten block pool (S28). Furthermore, the processor 115A extracts the current data and time from the refresh date-and-time column 701 of the refresh management information 700, and subtracts one from the number of refresh target blocks in the number-of-refresh-target-blocks column 702 corresponding to the extracted current date and time. Furthermore, the processor 115A deletes the block number of the refresh target block from the refresh target block number column 703 corresponding to the extracted current date and time. In this way, the processor 115A updates the refresh management information 700 (S28).

The processor 115A judges whether there is an access request from the host system 101 or not (S29); and if an affirmative judgment is returned in this step, the processor 115A prioritizes the access request from the host system 101 and temporarily terminates the refresh processing.

Meanwhile, if a negative judgment is returned in step S29, the processor 115A proceeds to step S22 and continues the refresh processing on other blocks which require the execution of the refresh processing.

(1-5) Effects of Embodiment 1

As explained above, according to this embodiment, the refresh processing can be executed appropriately on each block based on the data retaining period management information 500, the reliability maintained period table 600, and the refresh management information 700, thereby preventing unnecessary refresh. Furthermore, since the access requests from the host system 101 are prioritized when refresh is executed, the deterioration of the apparatus performance due to the execution of the refresh processing can be prevented.

(2) Embodiment 2

(2-1) Configuration of Semiconductor Storage Apparatus

Referring to FIG. 1, the reference numeral 100B represents a semiconductor storage apparatus 100B according to Embodiment 2 as a whole. This semiconductor storage apparatus 100B is configured in the same manner as the semiconductor storage apparatus 100A according to Embodiment 1, except that the validity of the reliability maintained period is checked. More specifically, in Embodiment 2, the number of failure bits of all pages in a block is actually read and measured, and the validity of the reliability maintained period based on the measurement result is checked. This detailed measurement of failure bits for the block will be hereinafter referred to as verification. By performing verification for each block during the reliability maintained period, a block which is different from the predicted tendency of the number of failure bits to increase can be detected, and refresh can be executed before an ECC correction disability failure occurs even if the number of failure bits increases more rapidly than predicted.

(2-2) Configurations of Various Management Information

FIG. 11 shows verification management information 800 from among the management information stored in the RAM 113 for the semiconductor storage apparatus 100B. The verification management information 800 is used to manage a scheduled date for performing verification and is constructed from a verification date-and-time column 801, a number-of-verification-target-blocks column 802, and a verification target block number column 803.

A scheduled date and time for performing verification in the future is stored in the verification date-and-time column 801, and the number of blocks as target blocks on which verification will be performed is stored in the number-of-verification-blocks column 802. Furthermore, the block numbers of the target blocks on which verification will be performed are stored in the verification target block number column 803.

Therefore, in case of FIG. 11, the table shows that, for example, verification is scheduled to be performed on 2010/08/21, the number of blocks as the target blocks on which verification will be performed on this date and time is 21241, and that block numbers are 32449, 8742, 2, and so on.

Under this circumstance, even if it is not a case where verification is performed by using the verification management information 800 shown in the above-mentioned FIG. 11, if the number of failure bits obtained when reading data is peculiarly larger than the number of failure bits (threshold value) which is specified in advance, this read target block may be determined as a peculiar block and verification may be executed on the determined peculiar block. The threshold used for peculiar block determination is specified based on three conditions from among the use conditions of the blocks, that is, the degree of deterioration, the average number of times of reading per day, and the elapsed time since storing data. For example, for a block whose degree of deterioration is high, a high threshold is specified because it is apparent from the fact that the number of failure bits is larger as compared to a block whose degree of deterioration is low. Furthermore, for a block whose average number of times of reading per day is small, a low threshold is specified because the number of failure bits is smaller as compared to a block whose average number of times of reading per day is large. Furthermore, for a block whose elapsed time since storing data is long, a high threshold is specified because the number of failure bits is larger as compared to a block whose elapsed time is short. When the threshold is specified as described above for each use condition of the block by combining three conditions for the block, a failure bit number from a number-of-failure-bits threshold table explained below is used (see FIG. 12).

Figure 12:
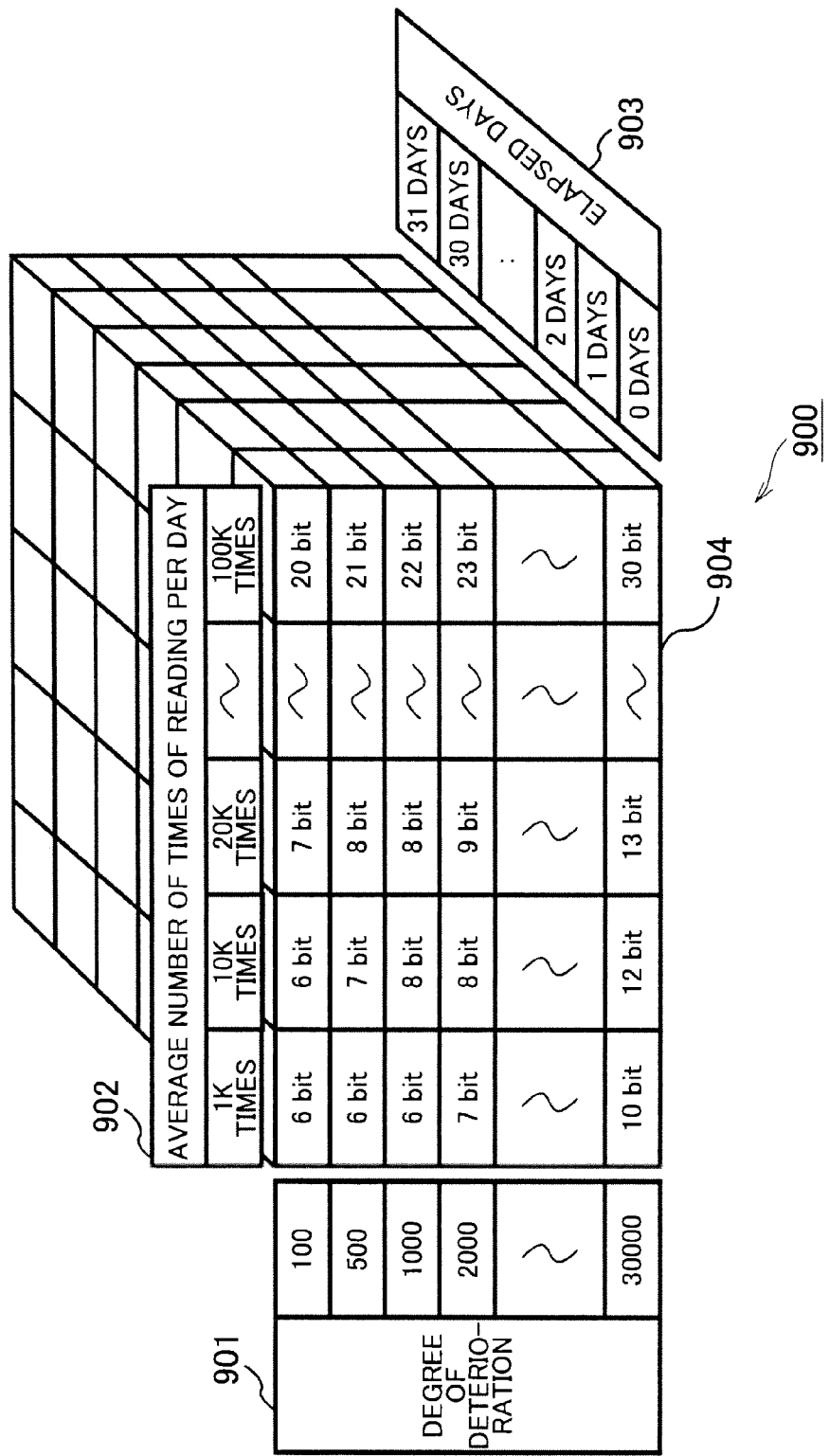
FIG. 12 is a conceptual diagram of a failure bit threshold table according to Embodiment 2.

FIG. 12 shows a number-of-failure-bits threshold table 900 from among the management information stored in the RAM 113 for the semiconductor storage apparatus 100B. The number-of-failure-bits threshold table 900 is used to determine a threshold used to determine the above-mentioned peculiar block.

The number-of-failure-bits threshold table 900 is a three-dimensional table which is constructed from a degree-of-deterioration column 901, an average number-of-times-of-reading-per-day column 902, an elapsed time (days) column 903, and a threshold column 904.

A value indicating the degree of deterioration of the block is stored in the degree-of-deterioration column 901, and an average number of times of reading per day is stored in the average number-of-times-of-reading-per-day column 902. Furthermore, elapsed time since storing data in the blocks until present is stored in the elapsed time column 903, and a threshold used for peculiar block determination (the number of failure bits) is stored in the threshold column 904.

Therefore, in the case of FIG. 12, the table shows that, for example, the threshold is 7 bits for the block whose degree of deterioration is 2000, whose average number of times of reading per day is 1000 times, and whose elapsed time is 0 days. Incidentally, if the degree of deterioration, the average number of times of reading per day, and the elapsed time of the block are not completely identical to the respective items in the number-of-failure-bits threshold table 900 shown in FIG. 12, the threshold for the block can be obtained by rounding off the relevant values or calculating approximate values so that they become identical to the respective items in the number-of-failure-bits threshold table 900.

Under this circumstance, the threshold stored in the threshold column 904 changes in accordance with the type and the respective characteristics of the adopted flash memory, so the retention property and the read disturb property of the flash memories adopted as the storage media are measured in advance, and a value calculated by reflecting the tendency of the number of failure bits, which is the measurement result, to increase is used. For example, if a block in which 10 more failure bits than the average number of failure bits occurred is specified as a judgment standard for peculiar block determination, 13 bits is used as the threshold for peculiar block determination under the use conditions (the degree of deterioration, the average number of times of reading per day, and the elapsed time since storing data) of the block whose average number of failure bits is 3 bits.

Furthermore, probability distribution of the occurrence of the number of failure bits may be measured for each of the conditions, that is, the degree of deterioration, the average number of times of reading per day, and the elapsed time since storing data in the preliminary flash memory test, and that probability distribution may be used as the threshold to be stored in the threshold column 904.

It should be noted that each of the values in the threshold column 904 is determined based on the accuracy of the reliability maintained period required for the apparatus, and the accuracy of reliability of data retention by the semiconductor storage apparatus 100B can be improved by changing the threshold used for the peculiar block determination. Furthermore, the threshold is stored in the threshold column 904 and the threshold used for the peculiar block determination is obtained from this threshold column 904 in this embodiment; however, the invention is not necessarily limited to this example, and a value calculated according to a formula may also be used for the peculiar block determination. For example, the number of failure bits which occurred may be measured for each condition which is a combination of the degree of deterioration, the average number of times of reading per day, and the elapsed time since storing data, for measurement in the preliminary flash memory test, a function with three variables specified as respective conditional variables based on the above measured values may be created, and the function may be stored in the RAM 113. Subsequently, at the time of the peculiar block determination, the threshold may be calculated by assigning the degree of deterioration, the average number of times of reading per day, and the elapsed date and time since storing data to the function which was created in advance.

Furthermore, the division units of the respective items in the average number-of-times-of-reading-per-day column 902 in FIG. 12 are 1000 times, 10000 times, and 20000 times; however the invention is not necessarily limited to this example; and if the accuracy of the peculiar block determination needs to be improved in the semiconductor storage apparatus 100B, a number-of-failure-bits threshold table 900 may be created by using smaller division units of the respective items of the average number of times of reading per day. Furthermore, the division units of the respective items in the degree of deterioration column may also be made smaller.

The accuracy of the number-of-failure-bits threshold table 900 can be changed in accordance with conditions such as the reliability required for the semiconductor storage apparatus 100B, the production process of the flash memories adopted as the storage media, SLC (Single Level Cell), MLC (Multi Level Cell), and TLC (Triple Level Cell).

(2-3) Processing Sequence of Various Processing

Figure 13:
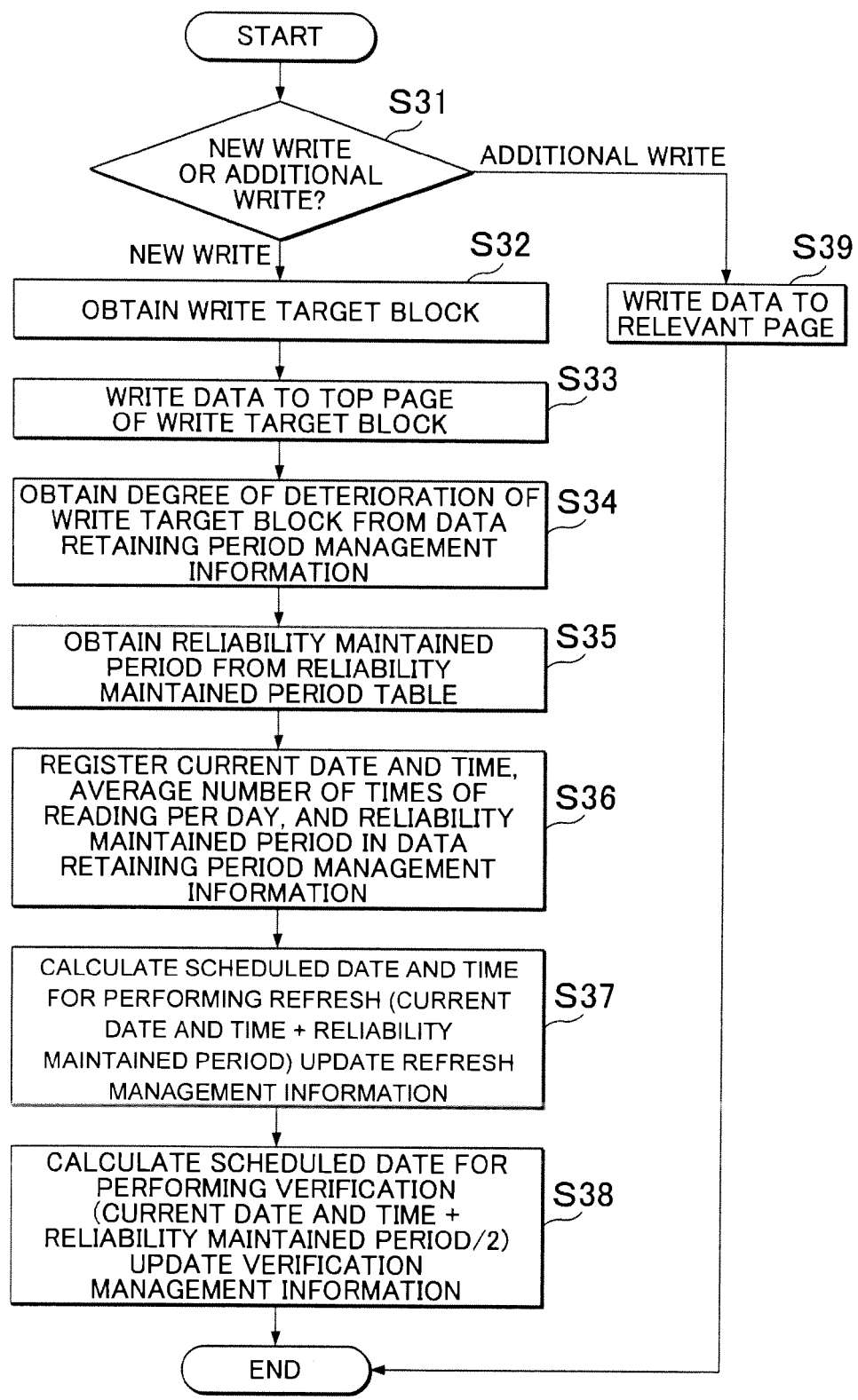
FIG. 13 is a flowchart of write processing according to Embodiment 2.

FIG. 13 shows a processing sequence of write processing executed by the processor 115B in the semiconductor storage apparatus 100B. After receiving a write request including data and a write location LBA from the host system 101, the processor 115B starts this write processing shown in FIG. 13.

Since the processing in steps from S31 to S37 and S39 is the same as the processing in steps from S1 to S8 in FIG. 8, an explanation about it has been omitted.

In step S38, the processor 115B adds half of a period of time of the reliability maintained period obtained in step S35 to the current date and time, and calculates it as a scheduled date for performing verification (S38). Subsequently, the processor 115B extracts the same date and time as the calculated scheduled date and time for performing verification from the verification date-and-time column 801 in the verification management information 800, and adds one to the number of blocks in the number-of-verification-target-blocks column 802 corresponding to the extracted date and time. Furthermore, the processor 115B stores the block number of the write target block obtained in step S32 in the verification target block number column 803 corresponding to the extracted date and time. Furthermore, at the same time, the processor 115B subtracts one from the number of blocks in the number-of-verification-target-blocks column 802 corresponding to the scheduled date for performing verification which has been planned, and also deletes the block number of the write target block from the verification target block number column 803. In this way, the processor 115A updates the verification management information 800 (S38) and then terminates the write processing.

Incidentally, the scheduled date for performing verification is calculated by adding half of a period of time of the reliability maintained period to the current date and time; however, the invention is not limited to this example, and it is only necessary to set the scheduled date for performing verification within the reliability maintained period. For example, the number of days which is three days shorter than the reliability maintained period may be added to the current date and time and the obtained date may be set as the scheduled date for performing verification. In this case, verification will be executed three days before the scheduled date for performing refresh.

Figure 14:
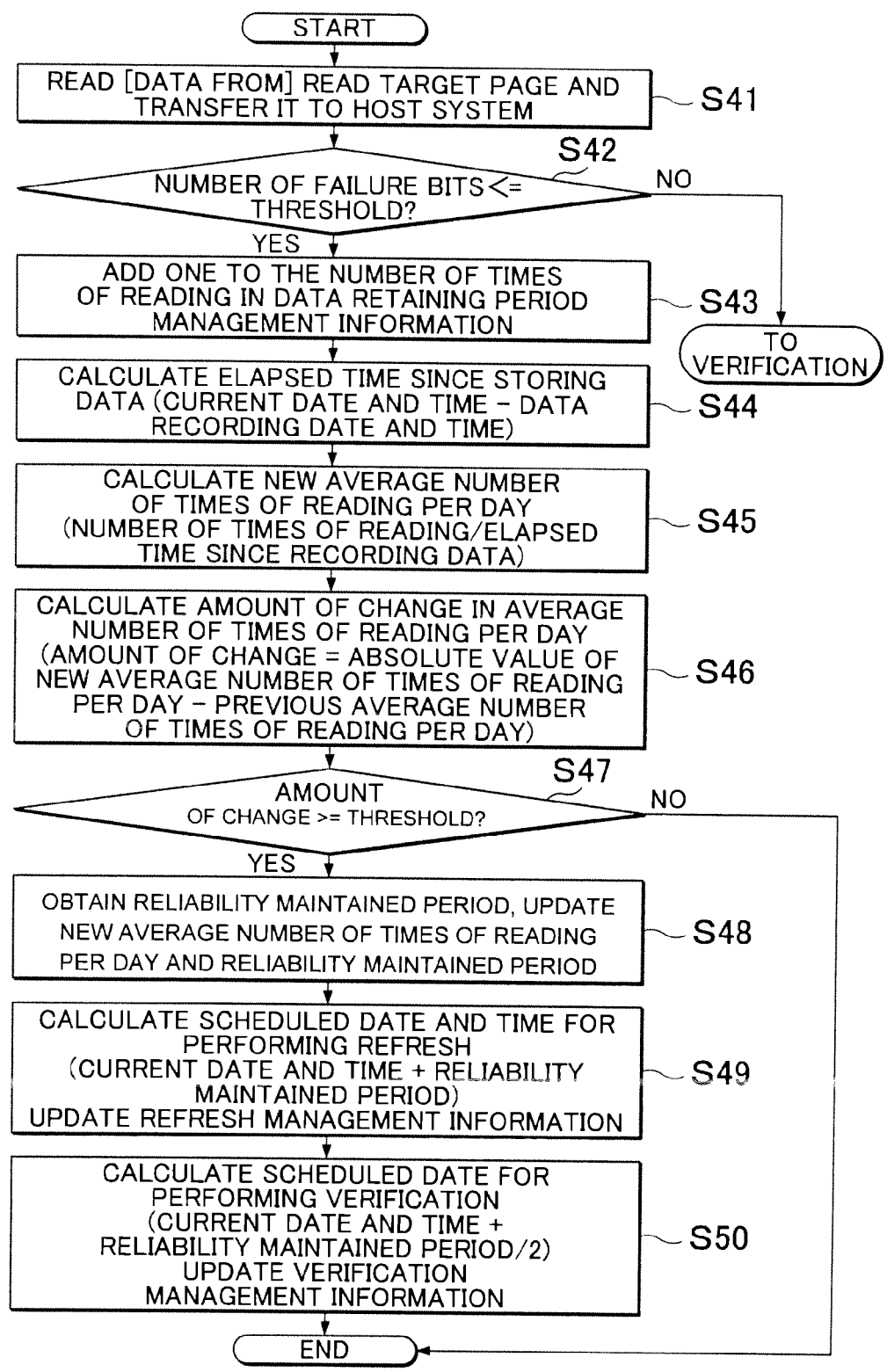
FIG. 14 is a flowchart of read processing according to Embodiment 2.

Meanwhile, FIG. 14 shows a processing sequence of read processing executed by the processor 115B for the semiconductor storage apparatus 100A. After receiving a read request including a read location LBA from the host system 101, the processor 115B starts this read processing shown in FIG. 14.

Since the processing in steps from S41 and S43 to S49 is the same as the processing in steps from S11 to S18 in FIG. 9, an explanation about it has been omitted.

The processor 115B judges in step S42 whether the number of failure bits in a read target page obtained when reading data in step S41 is equal to or smaller than the threshold obtained from the number-of-failure-bits threshold table 900 in FIG. 12 or not (S42). As the processing for obtaining the threshold from the number-of-failure-bits threshold table 900 in FIG. 12, the processor 115B firstly obtains the elapsed time since storing data, the number of times of reading, and the degree of deterioration of the read target block from the data retaining period management information 500, and then calculates the average number of times of reading per day by dividing the obtained number of times of reading by the elapsed time since storing data. Subsequently, the processor 115B obtains the number of failure bits, as the threshold, corresponding to each of the degree of deterioration, the average number of times of reading per day, and the elapsed time since storing data from the threshold table for failure bits 900.

If a negative judgment is returned in this step, the processor 115B determines that the block including this read target page is a peculiar block having a large number of failure bits; and executes verification on this peculiar block in order to check the occurrence status of failure bits. It should be noted that the reliability maintained period is not calculated and the scheduled date for performing refresh is not calculated for this peculiar block.

Meanwhile, if an affirmative judgment is returned in step S42, the processor 115B proceeds to step S43 and performs the read processing explained above with reference to FIG. 9.

As explained above, verification is performed both in the case where the verification is performed on the scheduled date and time specified by the verification management information 800 and in case the where a peculiar block is detected in step S42.

Meanwhile, in step S50, the processor 115B calculates a scheduled date for performing verification by adding a half of a period of time of the new reliability maintained period obtained in step S48 to the current date and time (S50). Subsequently, the processor 115B extracts the same date and time as the calculated scheduled date and time for performing verification from the verification date-and-time column 801 in the verification management information 800, adds one to the number of blocks to be stored in the number-of-verification-target-blocks column 802 corresponding to the extracted date and time, and also stores the block number of the read target block in the verification target block number column 803. At the same time, the processor 115B subtracts one from the number of read target blocks in the number-of-verification-blocks column 802 corresponding to the scheduled date for performing verification which has been planned, and also deletes the block number of the read target block from the verification target block number column 803. As explained above, the processor 115B updates the verification management information 800 (S50) and then terminates the read processing.

Figure 15:
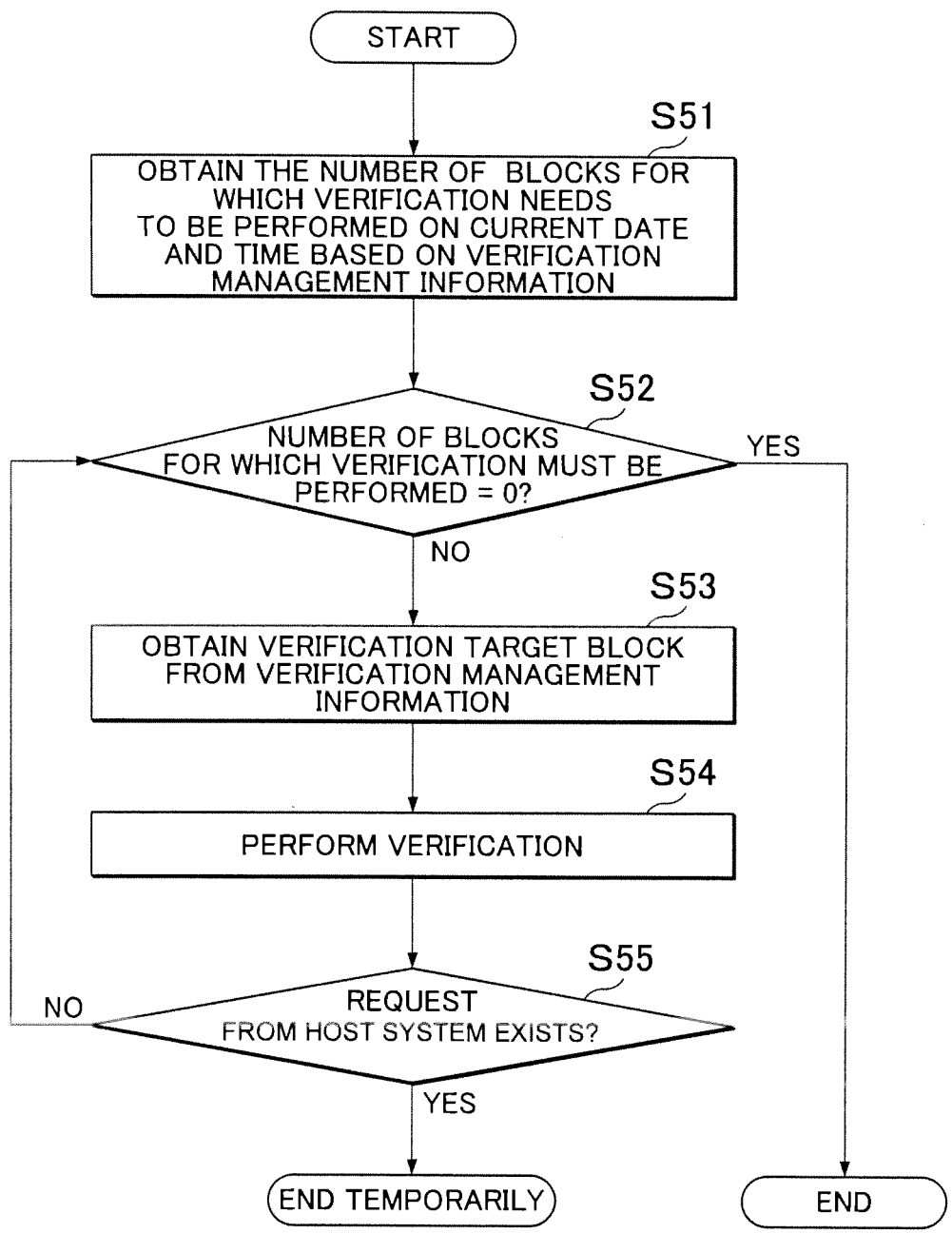
FIG. 15 is a flowchart of verification control processing according to Embodiment 2.

Meanwhile, FIG. 15 shows a processing sequence of verification control processing executed by the processor 115B for the semiconductor storage apparatus 100B. The processor 115B starts this verification control processing regularly at the timing when there is no access request from the host system 101 in order to prevent the performance deterioration of the apparatus due to competition between the execution of verification and access requests from the host system 101.

The processor 115B firstly extracts the same date and time as the current date and time from the verification date-and-time column 801 in the verification management information 800, and obtains the number of verification target blocks from the number-of-verification-target-blocks column 802 corresponding to the extracted date and time (S51).

Subsequently, the processor 115B judges whether the number of verification target blocks obtained in step S51 described above is 0 or not (S52).

If an affirmative judgment is returned in this step, the processor 115B determines that no block requiring the execution of verification exists; and then terminates this verification control processing.

Meanwhile, if a negative judgment is returned in step S52, the processor 115B obtains one block number of the verification target blocks from the verification target block number column 803 of the verification management information 800 (S53).

Subsequently, the processor 115B executes verification on the block with the block number obtained in step S53 (S54). The details of the verification processing will be explained later (see FIG. 16).

Next, the processor 115B judges whether there is an access request from the host system 101 or not (S55); and if an affirmative judgment is returned in this step, the processor 115B prioritizes the access request from the host system 101 and then temporarily terminates the verification control processing.

On the other hand, if a negative judgment is returned in step S55, the processor 115B proceeds to step S52 and continues the verification control processing on other blocks requiring the execution of verification. Incidentally, if access requests from the host system 101 occur sequentially and it is determined that verification cannot be executed on the blocks stored in the verification management information 800 within the scheduled date and time, the access requests from the host system 101 may be stopped and the verification control processing may be prioritized.

Figure 16:
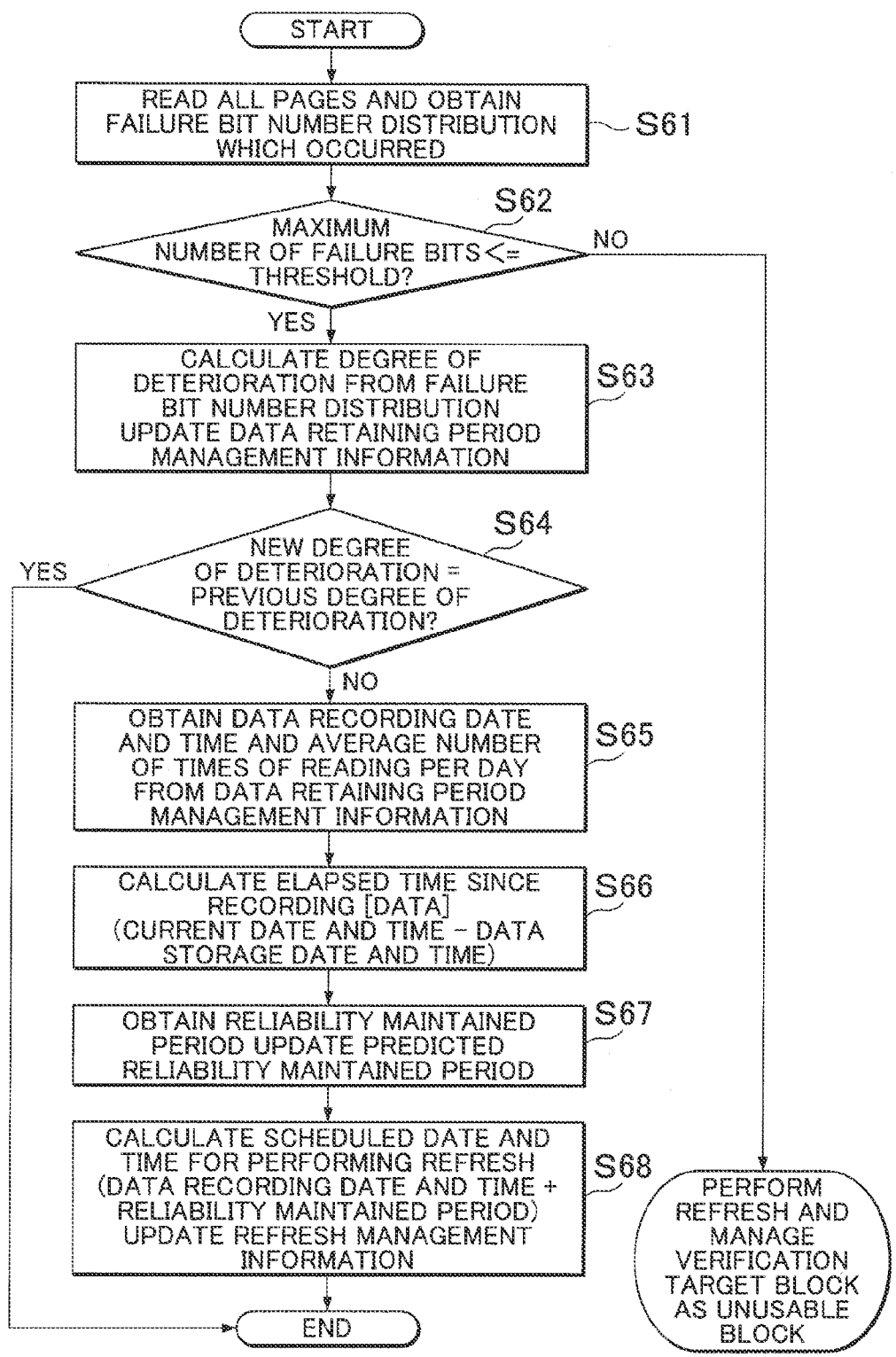
FIG. 16 is a flowchart of verification processing according to Embodiment 2.

FIG. 16 shows a processing sequence of the verification processing executed by the processor 115B for the semiconductor storage apparatus 100B. When a peculiar block is detected (see S42 in FIG. 14) or if it is determined that it is the time for performing verification by the verification control processing (see S54 in FIG. 15), the processor 115B starts this verification processing.

Firstly, the processor 115B reads all the pages in the verification target block, obtains the number of failure bits per ECC/CW on each page, and also obtains the failure bit number distribution and the maximum number of failure bits in the relevant block from the obtained number of failure bits (S61). It should be noted that the processor 115B obtains the number of failure bits by means of the flash memory interface 117 and the obtained number of failure bits is stored in the RAM 113.

Subsequently, the processor 115B judges whether the maximum number of failure bits obtained in step S61 is equal to or smaller than a previously specified threshold or not (S62). The threshold in this step is the maximum number of failure bits allowed within the semiconductor storage apparatus 100B.

If a negative judgment is returned in this step, the processor 115B determines that this verification target block has too many failure bits to be used as a storage area; and then performs refresh immediately and manages the block as an unusable block which cannot be used thereafter.

On the other hand, if an affirmative judgment is returned in step S62, the processor 115B determines that this verification target block has a small number of failure bits and can be used as a storage area continuously and that it is not necessary to perform refresh immediately; and then proceeds to step S63 explained below in order to decide the optimum degree of deterioration.

The processor 115B determines the degree of deterioration based on the failure bit number distribution obtained in step S61, stores the determined degree of deterioration in the degree-of-deterioration column 505 of the data retaining period management information 500 (see FIG. 5), and thereby updates this data retaining period management information 500 (S63). Incidentally, this method of determining the degree of deterioration based on the failure bit number distribution will be explained later (see FIG. 17).

Subsequently, the processor 115B judges whether or not the new degree of deterioration determined in step S63 is the same as the degree of deterioration stored in the data retaining period management information 500 before being updated in step S63 (S64).

If an affirmative judgment is returned in this step, the processor 115B terminates the verification processing. On the other hand, if a negative judgment is returned in this step, the processor 115B proceeds to step S65 in order to calculate the scheduled date for performing refresh based on the new degree of deterioration.

The processor 115B obtains the data storage date and time and the average number of times of reading per day from the data storage date-and-time column 502 and the average number-of-times-of-reading-per-day column 506 in the data retaining period management information 500 (S65).

Next, the processor 115B calculates the elapsed time since storing data of the verification target block by subtracting the data storage date and time obtained in step S65 from the current date and time (S66).

Then, the processor 115B refers to the reliability maintained period table 600 (see FIG. 6), obtains the new reliability maintained period by using the new degree of deterioration determined in step S63 and the average number of times of reading per day obtained in step S65, stores the obtained new reliability maintained period in the reliability maintained period column 507 in the data retaining period management information 500, and thereby updates the data retaining period management information 500 (S67).

Subsequently, the processor 115B calculates the scheduled date for performing refresh by adding the reliability maintained period obtained in step S67 to the data storage date and time obtained in step S65 (S68). Then, the processor 115B extracts the same date and time as the calculated scheduled date for performing refresh from the refresh date-and-time column 701 of the refresh management information 700, adds one to the number of blocks stored in the number-of-refresh-blocks column 702 corresponding to the extracted date and time, and also stores the block number of the verification target block in the refresh target block number column 703. At the same time, the processor 115B subtracts one from the number of blocks in the number-of-refresh-blocks column 702 corresponding to the scheduled data for performing refresh which has been planned, and deletes the block number of the verification target block from the refresh target block number column 703. In this way, the processor 115B updates the refresh management information 700 (S68) and then terminates the verification processing.

Figure 17:
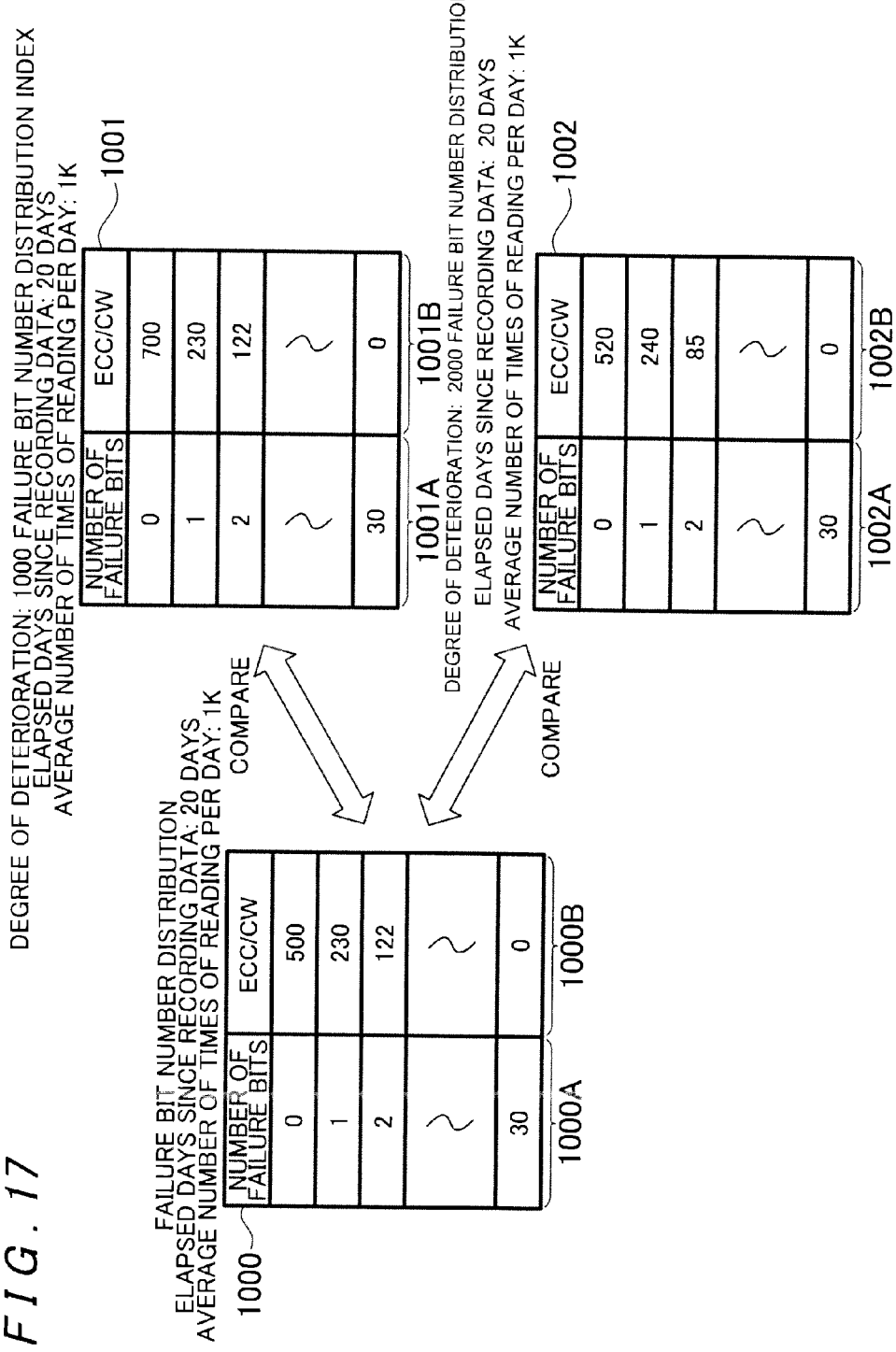
FIG. 17 is a conceptual diagram of failure bit number distribution according to Embodiment 2.

(2-4) Configuration of Failure Bit Number Distribution and Failure Bit Number Distribution Indexes FIG. 17 shows failure bit number distribution 1000 and failure bit number distribution indexes 1001 and 1002, which are stored in the RAM 113 for the semiconductor storage apparatus 100B. The failure bit number distribution 1000 and the failure bit number distribution indexes 1001 and 1002 are used to calculate the degree of deterioration in the above-mentioned verification processing (see FIG. 16). The failure bit number distribution 1000 is obtained in step S61 in the above-mentioned verification processing, and the failure bit number distribution indexes 1001 and 1002 are stored in the RAM 113 in advance and are created based on the result of measuring the failure bit number distribution for each condition of the degree of deterioration, the average number of times of reading per day, and the elapsed time since storing data in the preliminary flash memory test.

The failure bit number distribution 1000 indicates the failure bit number distribution of the verification target block whose elapsed time since storing data is 20 days and whose average number of times of reading per day is 1000 times. The failure bit number distribution 1000 is constructed from a number-of-failure-bits column 1000A and an ECC/CW column 1000B. The numbers of failure bits from 0 to a certain number are sequentially stored in the number-of-failure-bits column 1000A and the number of ECC/CWs corresponding to the number of failure bits stored in the number-of-failure-bits column 1000A is stored in the ECC/CW column 1000B.

Therefore, in the case of FIG. 17, the failure bit number distribution 1000 shows that, for example, 500 ECC/CWs where no failure bit has occurred, 230 ECC/CWs where only one failure bit has occurred, and 122 ECC/CWs where two failure bits have occurred exist in the verification target block.

Furthermore, the failure bit number distribution index 1001 indicates the failure bit number distribution of a block whose degree of deterioration is 1000, whose elapsed time since storing data is 20 days, and whose average number of times of reading per day is 1000 times. The failure bit number distribution index 1001 is constructed from a number-of-failure-bits column 1001A and an ECC/CW column 1001B in the same manner as the above-mentioned failure bit number distribution 1000, and the number of failure bits and the number of corresponding ECC/CWs are respectively stored.

Therefore, in the case of FIG. 17, the failure bit number distribution index 1001 shows that, for example, 700 ECC/CWs where no failure bit has occurred, 230 ECC/CWs where only one failure bit has occurred, and 122 units ECC/CWs where two failure bits have occurred exist in the block whose degree of deterioration is 1000.

Furthermore, the failure bit number distribution index 1002 indicates the failure bit number distribution of a block whose degree of deterioration is 2000, whose elapsed time since storing data is 20 days, and whose average number of times of reading per day is 1000 times. The failure bit number distribution index 1002 is configured in the same manner as the above-mentioned failure bit number distribution index 1001, except that the degree of deterioration is different.

Therefore, in the case of FIG. 17, the failure bit number distribution index 1002 shows that, for example, 520 ECC/CWs where no failure bit has occurred, 240 ECC/CWs where only one failure bit has occurred, and 85 ECC/CWs where two failure bits have occurred exist in the block whose degree of deterioration is 2000.

In order to determine the degree of deterioration of the failure bit number distribution 1000 under the above-described circumstance, the processor 115B compares the failure bit number distribution indexes 1001 and 1002 whose elapsed time since storing data and the average number of times of reading per day are the same as those of the failure bit number distribution 1000, by using them.

As a method of comparison, for example, the processor 115B calculates an absolute value of the difference in the number of ECC/CWs with respect to each number of failure bits between the failure bit number distribution 1000 and the respective failure bit number distribution indexes (1001 and 1002 in this example) and sums the absolute values of the differences in the number of ECC/CWs with respect to all the failure bits, thereby calculating a total value. Subsequently, the processor 115B determines the failure bit number distribution index with the smallest total value as a failure bit number distribution index most similar to the failure bit number distribution 1000, and determines the degree of deterioration of this determined failure bit number distribution index as the new degree of deterioration of the verification target block.

Specifically speaking, in the comparison between the failure bit number distribution 1000 and the failure bit number distribution index 1001, the number of ECC/CWs when the number of failure bits is 0 is 500 ECC/CWs and 700 ECC/CWs, respectively, so the absolute value of the difference in the number of ECC/CWs is 200 ECC/CWs. Furthermore, the number of ECC/CWs when the number of failure bits is 1 is 230 units which is the same for both the failure bit number distribution 1000 and the failure bit number distribution index 1001, so the absolute value of the difference in the number of ECC/CWs is 0 units. In this way, the processor 115B calculates the absolute values of the differences in the number of ECC/CWs with respect to all the numbers of failure bits, and calculates the total value of these absolute values.

Meanwhile, the processor 115B compares the failure bit number distribution 1000 with the failure bit number distribution index 1002 in the same manner, calculates absolute values of the differences in the number of ECC/CWs with respect to all the numbers of failure bits, and calculates the total value of these absolute values.

Then, the processor 115B determines the degree of deterioration of the failure bit number distribution index with the smallest total value from among the two calculated total values of the absolute values of the differences between the number of ECC/CWs as the new degree of deterioration. It should be noted that the new degree of deterioration is determined by using the two failure bit number distribution indexes in this example; however, the invention is not limited to this example, and a new degree of deterioration may be determined by using failure bit number distribution indexes corresponding to a plurality of degrees of deterioration in accordance with the accuracy of the managed degrees of deterioration.

As another method for determining the new degree of deterioration, for example, the total value of all the numbers of ECC/CWs stored in the ECC/CW column 1000B of the failure bit number distribution 1000, that is, the total value of all the numbers of failure bits that occurred in the verification target block may be compared with the total value of all the numbers of ECC/CWs stored in the ECC/CW columns 1001B and 1002B of the failure bit number distribution indexes 1001 and 1002 and the degree of deterioration of the failure bit number distribution index which calculated the total value closest to the total value of all the numbers of ECC/CWs in the ECC/CW column 1000B may be determined as the new degree of deterioration.

Furthermore, the failure bit number distribution indexes 1001 and 1002 may be stored in the RAM 113 by using parameters of distribution functions, and use them for the above-mentioned comparison. More specifically, the parameters such as an average bit failure rate of binominal distribution indicating the failure bit number distribution and an average number of failure bits per ECC/CW of Poisson distribution are used for each of the failure bit number distribution indexes for each of degree of deterioration, elapsed time since storing data, and average number of times of reading per day. The degree of deterioration may be determined by comparing the values of the distribution functions, to which the above-mentioned respective parameters are assigned, with the failure bit number distribution 1000 in the same manner as the comparison with the above-mentioned failure bit number distribution indexes. Incidentally, this embodiment has described the case where the degree of deterioration is determined when executing the verification processing; however, the degree of deterioration may be also determined in the same manner when executing the refresh processing, in order to improve the prediction accuracy of the reliability maintained period when writing data next time. Specifically speaking, the degree of deterioration can be changed at the time of refresh by also executing the verification processing in FIG. 16 when reading data in step S25 in FIG. 10.

(2-5) Screen Configuration

FIG. 18 is a configuration example of a management screen 1100 displayed on the management apparatus 102. It should be noted that the management screen 1100 may be displayed on the semiconductor storage apparatus 100B under the control of the processor 115B. The system administrator can set the respective values stored in the reliability maintained period table 600 (see FIG. 6) and the number-of-failure-bits threshold table 900 (see FIG. 12) by using this management screen 1100 in accordance with the reliability required for the semiconductor storage apparatus 100B.

The management screen 1100 is constructed from a reliability mode selection area 1101, an allowable number-of-failure-bits area 1102, a longest refresh cycle area 1103, and an allowable degree-of-deterioration area 1104 as items to be operated by the system administrator; and the management screen 1100 also includes an average degree-of-deterioration area 1105, an average refresh cycle area 1106, an average verification cycle area 1107, and a number-of-unusable-blocks area 1108 as items indicating the status of the semiconductor storage apparatus 100B. Furthermore, the management screen 1100 includes a message window 1109 for reporting a certain type of message to the system administrator.

The reliability mode selection area 1101 is an area for the system administrator to set the reliability of the semiconductor storage apparatus 100B and to select one of a plurality of radio buttons (three buttons in this example). The types of reliability which can be selected are a consumer mode, an enterprise mode, and a custom mode.

The consumer mode is a mode operating based on the reliability such as 1 unusable sector per $10^{14}$ bits; and the enterprise mode is a mode operating based on the reliability such as 1 unusable sector per $10^{16}$ bits and operating while maintaining the higher reliability than that of the consumer mode. Based on the reliability which is set according to these modes, the semiconductor storage apparatus 100B can change the respective reliability maintained periods in the reliability maintained period table 600 (see FIG. 6), the respective thresholds in the number-of-failure-bits threshold table 900 (see FIG. 12), and a threshold for determining unusable blocks used in step S62 in FIG. 16. For example, if the enterprise mode is selected, the respective values in the reliability maintained period table 600 will become smaller than those in the consumer mode and the refresh period will be shortened. Similarly, if the enterprise mode is selected, the values in the number-of-failure-bits threshold table 900 will become smaller than those in the consumer mode, and blocks with even smaller number of failure bits will be determined as unusable blocks.

It should be noted that the semiconductor storage apparatus 100B stores the respective reliability maintained period tables 600 and the number-of-failure-bits threshold tables 900 in the two modes, the consumer mode and the enterprise mode, in the RAM 113; and realizes the function changing the above-mentioned reliability standard by changing the table to refer to subject to the change of the mode.

Furthermore, the custom mode is a mode for the system administrator to manually input arbitrary values respectively in the allowable number-of-failure-bits area 1102, the longest refresh cycle area 1103, and the allowable degree-of-deterioration area 1104 instead of changing the reliability standard as in the cases of the consumer mode and the enterprise mode.

Furthermore, the allowable number-of-failure-bits area 1102 is an area for the system administrator to input the number of failure bits allowed in the ECC/CW, and a block including the ECC/CW with the number of failure bits exceeding the number of failure bits input in this area is determined to be unusable by the processor 115B.

Furthermore, the longest refresh cycle area 1103 is an area for the system administrator to input an upper limit of the refresh cycle, and refresh is forcibly executed on a block with the refresh cycle exceeding the refresh cycle input in this area. More specifically, if the calculated scheduled date for performing refresh exceeds a value input in the longest refresh cycle area 1103 in the processing of calculating the scheduled date for performing refresh in step S7 in FIG. 8, step S18 in FIG. 9, step S37 in FIG. 13, step S49 in FIG. 14, and step S68 in FIG. 16, the longest refresh cycle will be stored as a refresh period in the refresh management information 700.

Furthermore, the allowable degree-of-deterioration area 1104 is an area for the system administrator to input an upper limit of the degree of deterioration of an area in the flash memory used as a storage area, and a block with the degree of deterioration exceeding the degree of deterioration input in this area is determined to be unusable by the processor 115B. As explained above, the system administrator can flexibly change the data maintenance reliability of the semiconductor storage apparatus 100B by inputting the arbitrary values in the management screen 1100.

Next, the average degree-of-deterioration area 1105 is an area for displaying an average of the degrees of deterioration of all the blocks in all the flash memories installed in the semiconductor storage apparatus 100B. The system administrator can recognize the lifetime of the semiconductor storage apparatus 100B (such as a remaining usable period, remaining rewritable capacity, and the degree of deterioration) by referring to the average value displayed in this area.

Furthermore, the average refresh cycle area 1106 is an area for displaying an average value of the refresh cycle of each of the blocks executed by the semiconductor storage apparatus 100B. The system administrator can recognize the influence of the performance deterioration of the apparatus by refresh by referring to the average value displayed in this area.

Furthermore, the average verification cycle area 1107 is an area for displaying an average value of the verification cycle of each of the blocks executed by the semiconductor storage apparatus 100B. The system administrator can recognize the influence of the performance deterioration of the apparatus by verification by referring to the average value displayed in this area.

Furthermore, the number-of-unusable-blocks area 1108 is an area for displaying the number of blocks which are determined to be unusable in step S62 in FIG. 16 with respect to all the blocks in all the flash memories installed in the semiconductor storage apparatus 100B. The system administrator can recognize the lifetime of the semiconductor storage apparatus 100B by referring to the number of unusable blocks displayed in this area.

(2-6) Effects of Embodiment 2

According to this embodiment as explained above, if it is determined that it is necessary to change the degree of deterioration by the verification processing (see FIG. 16), it is possible to calculate a new degree of deterioration based on the failure bit number distribution and calculate a new scheduled date for performing refresh based on the calculated new degree of deterioration. Therefore, regarding the peculiar block whose number of failure bits has increased peculiarly more than the predicted number of failure bits, it is possible to prevent the ECC correction disability failure by shortening the refresh period and maintain high data reliability. Meanwhile, regarding a block whose number of failure bits is peculiarly smaller than the predicted number of failure bits, it is possible to prevent the unnecessary refresh processing by prolonging the refresh period and prevent the performance deterioration of the apparatus. Furthermore, it is possible to improve the prediction accuracy of the reliability maintained period until writing data next time by changing the degree of deterioration.

Furthermore, the degree of deterioration is calculated based on the failure bit number distribution by verification by the verification processing (see FIG. 16) without recognizing the number of times of block deletion as the degree of deterioration. So, regarding a block whose number of times of deletion is large but whose data retaining property is good, it is possible to prolong the refresh period and thereby utilize the data retaining property effectively. On the other hand, regarding a block whose number of times of deletion is small but whose data retaining property is not good, it is possible to shorten the refresh period and thereby improve the data reliability.

(3) Embodiment 3

(3-1) Configuration of Semiconductor Storage Apparatus

Referring to FIG. 1, the reference numeral 100C represents a semiconductor storage apparatus 100C according to Embodiment 3 as a whole. This semiconductor storage apparatus 100C is configured in the same manner as the semiconductor storage apparatus 100A according to Embodiment 1, except that deterioration of response performance to the host system 101 is prevented by preventing the concentrated execution of refresh at a specific timing and that the reliability of data stored in the semiconductor storage apparatus 100C is maintained temporally constant.

In Embodiment 1 described earlier, the refresh target block requiring the execution of refresh is obtained from the refresh management information 700 and refresh is executed on the obtained refresh target block within the reliability maintained period. However, if refresh is performed by this method, there may be a case where refresh is executed in a manner concentrated on a specific date and time.

Subsequently, if the execution of refresh is concentrated, the semiconductor storage apparatus 100C stops the response to the host system 101 in order to maintain the data reliability and prioritizes the execution of refresh, but the performance of the apparatus becomes unstable at that time.

Furthermore, if blocks requiring the execution of refresh are concentrated even within the reliability maintained period, the blocks regarding which the risk of data loss has increased relatively will be unevenly located, the reliability of the entire semiconductor storage apparatus 100C increases and decreases temporally, and a period of time with the low reliability occurs.

Therefore, this embodiment alleviates the above-mentioned problem with refresh, stabilizes the response performance for the host system 101, and also maintains the reliability of the entire semiconductor storage apparatus 100C temporally constant.

(3-2) Configuration of Reliability Rank Management Information

Data retaining period management information and a reliability maintained period table which are used in Embodiment 3 are configured in the same manner as the data retaining period management information 500 and the reliability maintained period table 600 which are used in Embodiment 1, so an explanation about them has been omitted. Furthermore, in Embodiment 3, refresh is performed by using reliability rank management information 1200 explained below (see FIG. 19) instead of using the refresh management information 700.

FIG. 19 shows reliability rank management information 1200 from among the management information stored in the RAM 113 for the semiconductor storage apparatus 100C. The reliability rank management information 1200 is used to manage blocks of each reliability rank and constructed from a reliability rank column 1201, a number-of-allowable-blocks column 1202, a number-of-existing-blocks column 1203, and a block number column 1204.

Values indicating the relative degrees of reliability of blocks existing in the semiconductor storage apparatus 100C (reliability range) are stored in the reliability rank column 1201. The reliability is considered to be a value calculated by dividing the elapsed time since storing data in the relevant block by the reliability maintained period. For example, the reliability of a block whose elapsed time since storing data is 21 days and whose reliability maintained period is 30 days is 70% because 70% of the entire reliability maintained period has already elapsed. Subsequently, this block belongs to a reliability rank 60% to 89% in the case of FIG. 19.

It should be noted that this reliability rank is determined based on the retention property of the flash memory and is intended for classification of blocks under different use conditions in terms of data reliability. For example, regarding a block whose reliability maintained period is 30 days and whose elapsed time since storing data is 15 days and a block whose reliability maintained period is 20 days and whose elapsed time since storing data is 10 days, the reliability of both the blocks is 50% in spite of the different use conditions. So, the blocks are equally managed in terms of the timing for performing refresh.

The number-of-allowable-blocks column 1202 stores the number of allowable blocks which are allowed to exist in the semiconductor storage apparatus 100C for each reliability rank classified by the reliability rank column 1201. Incidentally, an arbitrary value determined by the system administrator is stored as this number of allowable blocks of each reliability rank in consideration of the stability of the apparatus performance and temporal increases and decreases of the reliability.

Furthermore, the number of existing blocks existing in the semiconductor storage apparatus 100C is stored in the number-of-existing-blocks column 1203 for each reliability rank classified by the reliability rank column 1201. Furthermore, the block numbers of the existing blocks existing in the relevant reliability rank are stored in the block number column 1204 of each reliability rank classified by the reliability rank column 1201.

Therefore, in the case of FIG. 19, the table shows that, for example, 14745 (20%) blocks at most whose reliability rank is 60% to 89% are allowed to exist in the semiconductor storage apparatus 100C and that 18432 (25%) blocks actually exist. The table also shows that the block numbers of the 18432 existing blocks existing in this reliability rank are 38754, 2444, 68221, and so on. Furthermore, regarding the reliability rank of 60% to 89%, the number of existing blocks exceeds the number of allowable blocks as explained above and, therefore, 3687 blocks, that is, the difference between the number of existing blocks and the number of allowable blocks, are targets of the execution of refresh.

It should be noted that the reliability ranks are classified into five levels in the reliability rank column 1201 of the reliability rank management information 1200 in FIG. 19; however, the number of levels is not necessarily limited to this example. Furthermore, the above-explained method for calculating the reliability rank is to divide the elapsed time since storing data by the reliability maintained period; however, the method is not limited to this example, and the reliability maintained period may be set as a constant value and the elapsed time since storing data may be simply determined as the reliability rank.

Furthermore, the failure bit number distribution for each elapsed time under each of the conditions (the degree of deterioration and the average number of times of reading per day) may be measured in advance and the reliability rank for each condition and elapsed time may be determined by using the distribution. For example, the reliability rank to be used may be designed so that if the reliability ranks are classified according to the probability that the number of failure bits exceeds 5 bits, and if the probability that the number of failure bits exceeds 5 bits is 10% in the preliminary flash memory test when 10 days have elapsed since storing the data in a block whose degree of deterioration is 1000 and the average number of times of reading per day is 1000 times, the reliability rank is managed as 5% to 29%.

(3-3) Processing Sequence of Various Processing

Figure 20:
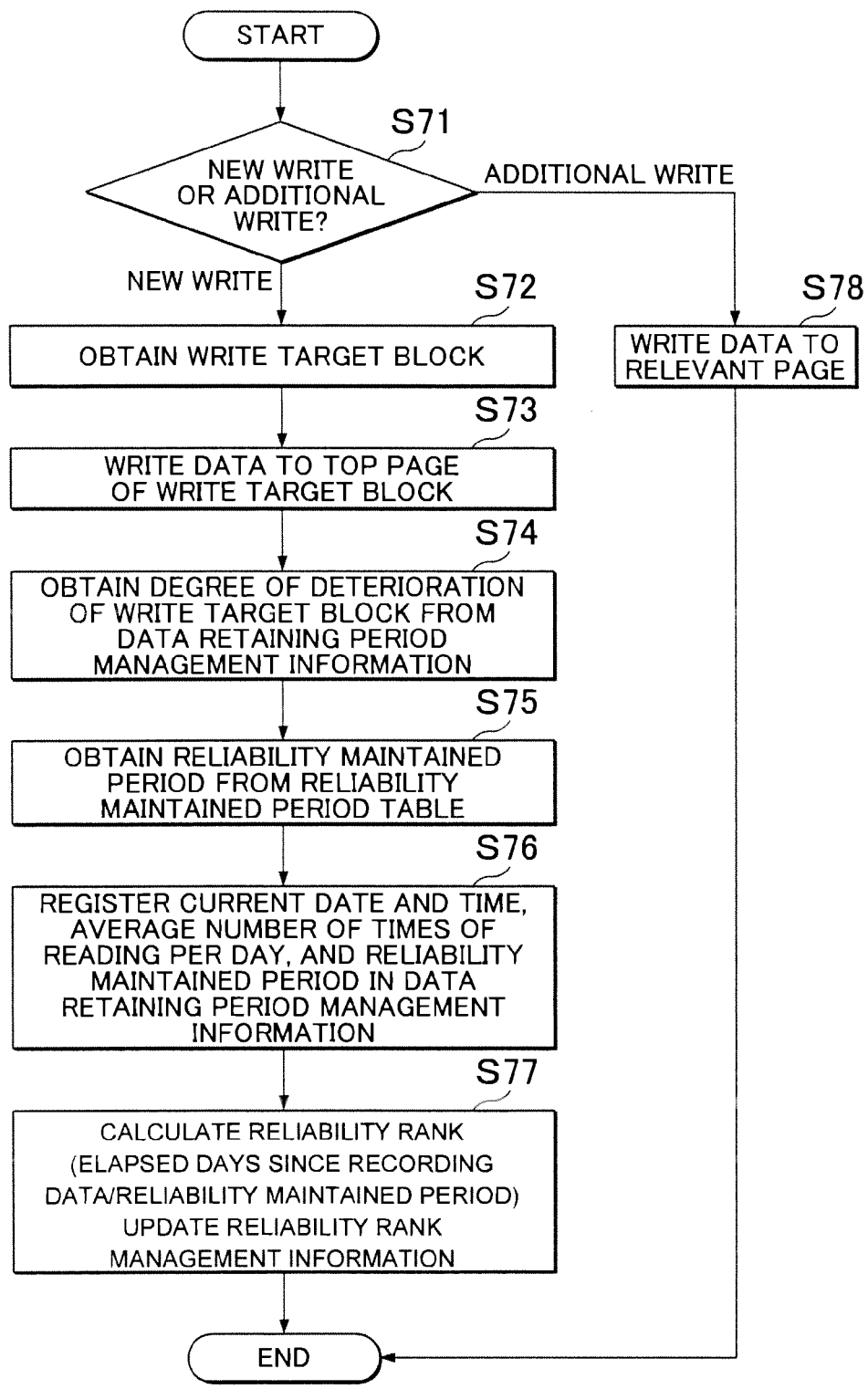
FIG. 20 is a flowchart of write processing according to Embodiment 3.

FIG. 20 shows a processing sequence of write processing executed by the processor 115C for the semiconductor storage apparatus 100C. The processor 115C starts this write processing shown in FIG. 20 after receiving a write request including data and a write location LBA from the host system 101.

Since the processing in steps from S71 to S76 and S78 is the same as the processing in steps from S1 to S6 and S8 in FIG. 8, an explanation about it has been omitted.

In step S77, the processor 115C calculates the reliability rank by dividing the elapsed time since storing data (whose value is zero because this is new write processing) by the reliability maintained period obtained in step S75 (S77). Subsequently, the processor 115C adds one to the number of blocks stored in the number-of-existing-blocks column 1203 (see FIG. 19) corresponding to this reliability rank, stores the number of the write target block in the block number column 1204, updates the reliability rank management information 1200 (S77), and terminates the write processing.

Figure 21:
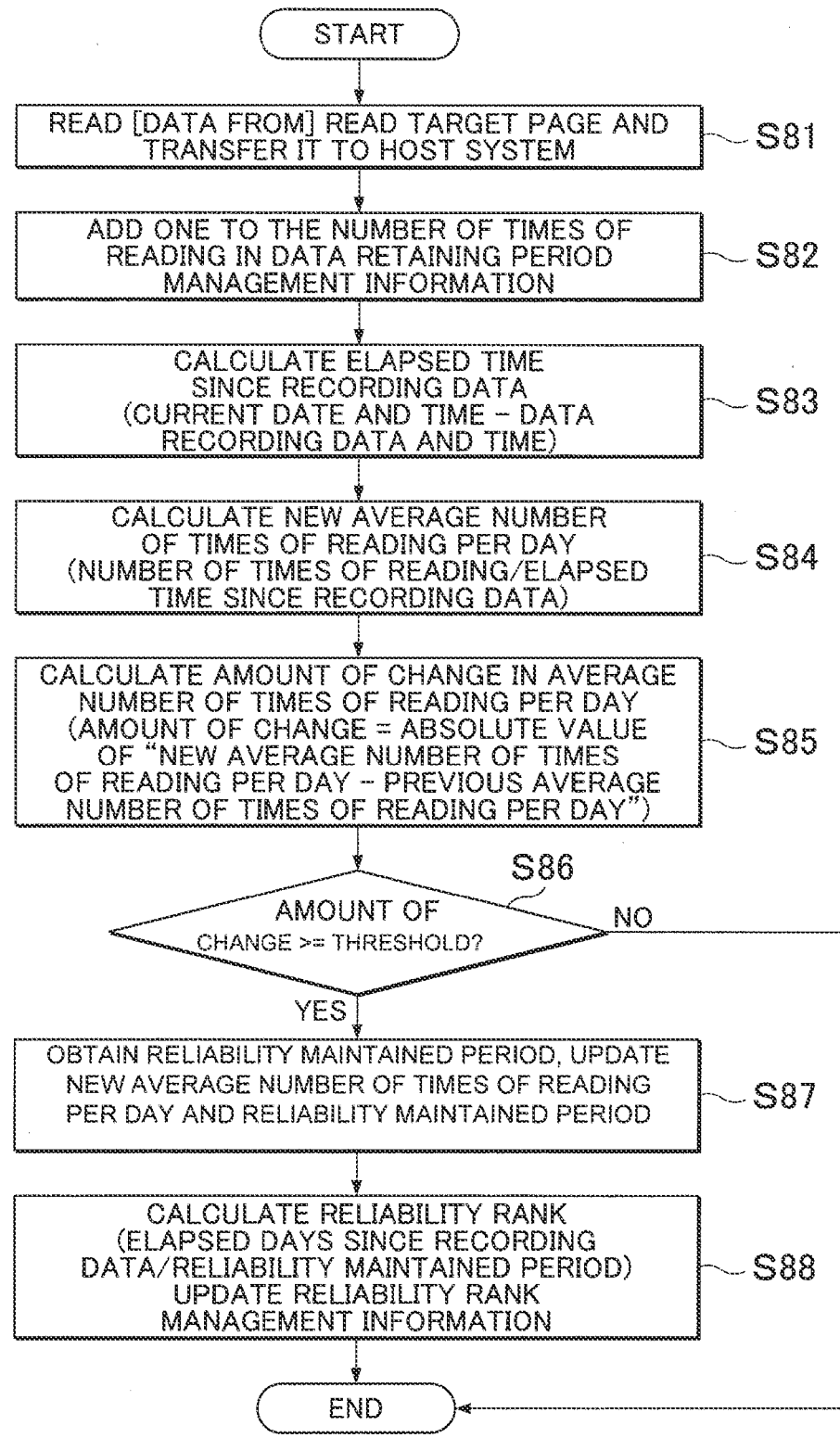
FIG. 21 is a flowchart of read processing according to Embodiment 3.

FIG. 21 shows the processing sequence of the read processing executed by the processor 115C of the semiconductor storage apparatus 100C. The processor 115C starts this read processing shown in FIG. 21 if receiving a read request including a read location LBA from the host system 101.

Since the processing in steps from S81 to S87 are the same as the processing in steps from S11 to S17 in FIG. 9, an explanation about it has been omitted.

In step S88, the processor 115C calculates the reliability rank by dividing the elapsed time since storing data calculated in step S83 by the reliability maintained period obtained in step S87 (S88). Subsequently, the processor 115C extracts the same reliability rank as the calculated reliability rank from the reliability rank column 1201 of the reliability rank management information 1200, adds one to the number of blocks stored in the number-of-existing-blocks column 1203 corresponding to the extracted reliability rank, and stores the block number of a read target block in the block number column 1204. At the same time, the processor 115C subtracts one from the number of blocks in the number-of-existing-blocks column 1203 corresponding to the previous reliability rank and deletes the block number of the read target block from the block number column 1204. In this way, the processor 115C updates the reliability rank management information 1200 (S88) and then terminates the read processing.

Incidentally, since the reliability rank of each block changes every day, the reliability rank management information 1200 may be updated regularly or irregularly besides the processing of updating the reliability rank management information 1200 in the above-mentioned read processing. For example, the processor 115C obtains the data storage date and time from the data storage date-and-time column 502 of the data retaining period management information 500 with respect to all the blocks at least once a day and calculates the elapsed time since storing data based on the difference from the current date and time. Meanwhile, the processor 115C obtains the reliability maintained period from the reliability maintained period column 507 and calculates the reliability rank by dividing the elapsed time by the reliability maintained period. Furthermore, the processor 115C may update the reliability rank management information 1200 based on this reliability rank calculated with respect to all the blocks.

Figure 22:
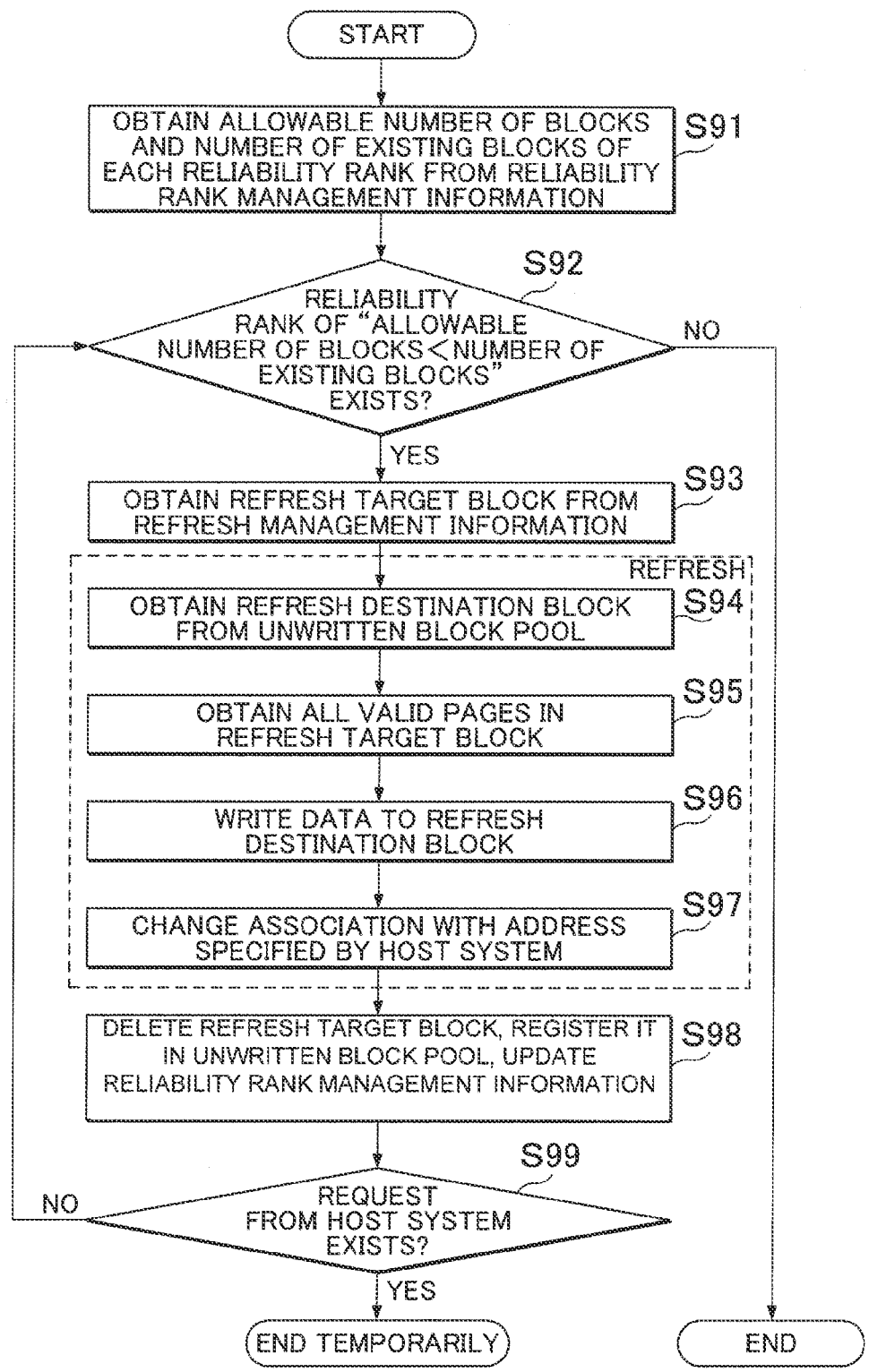
FIG. 22 is a flowchart of refresh processing according to Embodiment 3.

FIG. 22 shows a processing sequence of refresh processing executed by the processor 115C for the semiconductor storage apparatus 100C. The processor 115C starts the refresh processing regularly at the timing when there is no access request from the host system 101, in order to prevent the performance deterioration of the apparatus due to competition between access requests from the host system 101 and the refresh processing.

The processor 115C firstly obtains the number of allowable blocks and the number of existing blocks of each of the reliability ranks from the number-of-allowable-blocks column 1202 and the number-of-existing-blocks column 1203 of the reliability rank management information 1200 (S91).

Next, the processor 115C judges whether the reliability rank where the number of existing blocks is larger than the number of allowable blocks obtained in step S91 exists or not (S92).

If a negative judgment is returned in this step, the processor 115C determines that it is not necessary to perform refresh on the current date and time; and then terminates the refresh processing.

On the other hand, if an affirmative judgment is returned in step S92, the processor 115C determines that the blocks of the reliability rank where the number of existing blocks exceeds the number of allowable blocks are refresh target blocks; and randomly obtains one block number from among the refresh target blocks (S93).

Next, the processor 115C executes refresh on the block with the block number obtained in step S93 by the processing in steps from S94 to S97 (S94 to S97). Incidentally, the processing in steps from S94 to S97 is the same as the processing in steps from S24 to S27 in FIG. 10 and, therefore, an explanation about it has been omitted.

The processor 115C deletes data in the refresh target block obtained in step S93 and registers this refresh target block in the unwritten block pool (S98). Subsequently, the processor 115C adds one to the number of blocks in the number-ofexisting-blocks column 1203 corresponding to the reliability rank 0% to 4% in the reliability rank management information 1200, and stores the block number of the refresh target block after the execution of refresh in the block number column 1204. At the same time, the processor 115C obtains the reliability rank of the refresh target block before the execution of refresh from the reliability rank column 1201, and subtracts one from the number of blocks in the number-of-existing-blocks column 1203 corresponding to the obtained reliability rank. Furthermore, the processor 115C deletes the block number of the refresh target block from the block number column 1204 corresponding to the obtained reliability rank. In this way, the processor 115C updates the reliability rank management information 1200 (S98).

Subsequently, the processor 115C judges whether there is an access request from the host system 101 or not (S99), if an affirmative judgment is returned in this step, the processor 115C prioritizes the access request from the host system 101 and then temporarily terminates the refresh processing.

On the other hand, if a negative judgment is returned in step S99, the processor 115C proceeds to step S92 and continues the refresh processing for other blocks requiring the execution of refresh.

(3-4) Effects of Embodiment 3

According to this embodiment as explained above, the reliability of the entire semiconductor storage apparatus 100C can be maintained temporally constant by performing leveling control to ensure that the blocks whose reliability has relatively deteriorated will not be temporally unevenly located. Furthermore, if the number of allowable blocks is set in the reliability rank management information 1200 (see FIG. 19) so that it will decrease as the value of the reliability rank increases (i.e. as the reliability deteriorates), refresh will be executed in a step-by-step manner; and, therefore, the concentrated execution of refresh within a specific period can be prevented, and the deterioration of the response performance for the host system 101 can be alleviated.

(4) Embodiment 4

(4-1) Configuration of Semiconductor Storage Apparatus

Referring to FIG. 1, the reference numeral 100D represents a semiconductor storage apparatus 100D according to Embodiment 4 as a whole. This semiconductor storage apparatus 100D is configured in the same manner as the semiconductor storage apparatus 100A by Embodiment 1, except that verification is executed on all blocks in the installed flash memories and that the refresh period is determined for each block based on the number of failure bits obtained in the process of verification.

It should be noted that this semiconductor storage apparatus 100D is configured in the same manner as the semiconductor storage apparatus 100A according to Embodiment 1, except that the use conditions of each block such as the degree of deterioration, the elapsed time since storing data, and the average number of times of reading per day, which are used in Embodiments from 1 to 3 are not managed as the management information.

Furthermore, this semiconductor storage apparatus 100D executes general processing for storing data from the host system 101 in the flash memory during the write processing and also executes general processing for reading data from the flash memory and transferring it to the host system 101 in the read processing. Therefore, an explanation of such processing has been omitted.

This semiconductor storage apparatus 100D regularly executes verification on all the blocks in the installed flash memory independently from the write processing and the read processing.

More specifically, the semiconductor storage apparatus 100D executes the read processing for confirming the status of the occurrence of failure bits at least once in, for example, five days and determines a refresh cycle based on a threshold which is the maximum number of failure bits obtained when executing the read processing.

(4-2) Verification Processing

Figure 23:
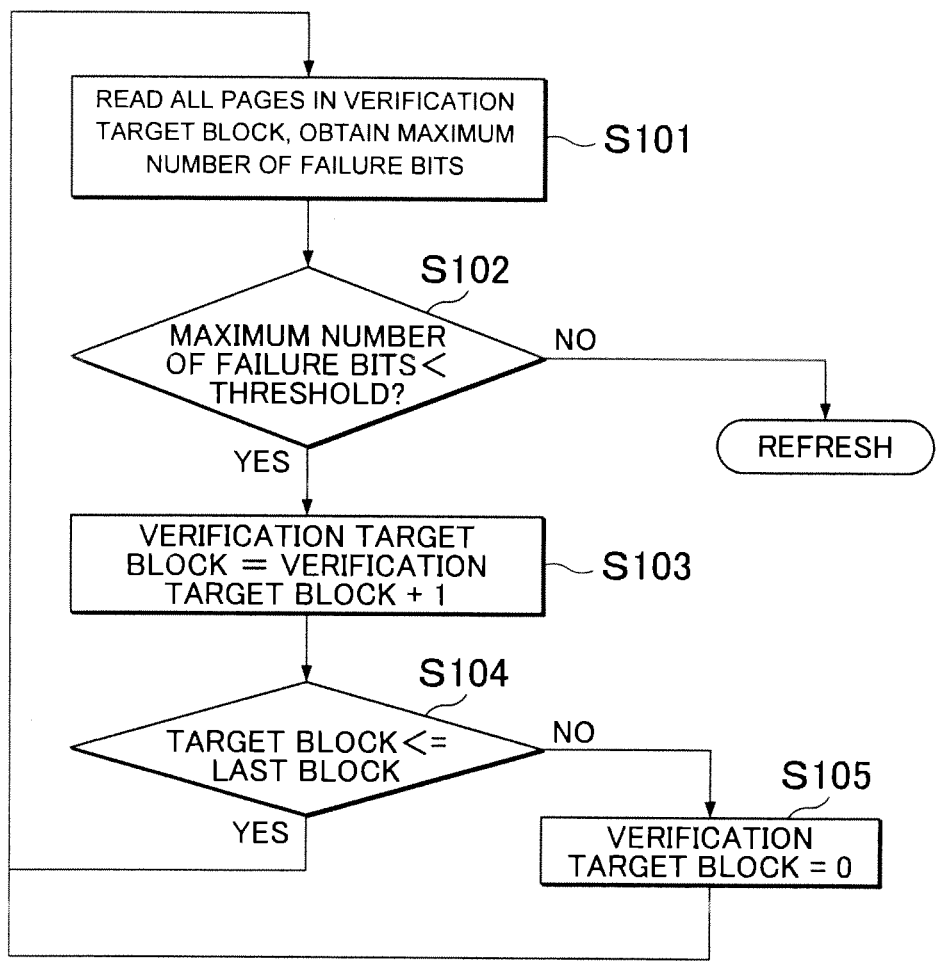
FIG. 23 is a flowchart of verification processing according to Embodiment 4.

FIG. 23 shows the processing sequence of the verification processing executed by the processor 115D for the semiconductor storage apparatus 100D. The processor 115D starts this verification processing shown in FIG. 23 regularly or irregularly while the semiconductor storage apparatus 100D is in operation (active).

It should be noted that the processor 115D executes this verification processing at an executable speed on all the storage areas in the flash memories installed in the semiconductor storage apparatus 100D. For example, if 20000 flash memories are installed in the semiconductor storage apparatus 100D and this verification processing is executed at least once in five days, the processor 115D ensures the execution of this verification processing on 4000 blocks per day. Incidentally, the processor 115D prioritizes the execution of the verification processing if this verification processing competes with access requests from the host system 101.

The processor 115D firstly reads all the pages in a verification target block, also stores the number of failure bits per ECC/CW on each of the pages, which are read, in the RAM 113, and obtains the maximum number of failure bits from the number of the failure bits per ECC/CW stored in the RAM 113 (S101).

Next, the processor 115D judges whether the maximum number of failure bits that occurred in the verification target block obtained in step S101 is smaller than a threshold or not (S102). It should be noted that the threshold used in this step is a value smaller than the number of bits which can be corrected by the ECC and changes in accordance with the reliability required for the semiconductor storage apparatus 100D. Generally, high reliability can be secured if a small threshold is used; and if a large threshold is used, the reliability deteriorates, but the refresh frequency can be suppressed.

If a negative judgment is returned in step S102 described above, the processor 115D determines that refresh is required; and then performs refresh.

On the other hand, if an affirmative judgment is returned in this step, the processor 115D determines that it is not necessary to perform refresh at that time; and proceeds to step S103. In this way, refresh can be executed separately for each of the blocks in accordance with the degree of deterioration and the read frequency of the relevant block by regularly executing verification independently from a response to the host system 101 and judging whether or not it is necessary to execute refresh.

The processor 115D adds one to the block number of the verification target block and obtains the block number of a block on which verification is to be executed next (S103).

Next, the processor 115D judges whether the block number obtained in step S103 is equal to or smaller than the last block number of all the flash memories installed in the semiconductor storage apparatus 100D or not (S104).

If an affirmative judgment is returned in this step, the processor 115D proceeds to step S101 and executes verification on the block of the block number obtained in step S103 as the verification target block.

On the other hand, if a negative judgment is returned in step S104, the processor 115D determines that it has executed verification at least once on the blocks in all the flash memories installed in the semiconductor storage apparatus 100D; returns the block number, to which one was added in step S103, to zero in order to execute verification again from the top block (S105); and proceeds to step S101. The processor 115D repeats the above-described processing regularly.

(4-3) Effects of Embodiment 4

According to this embodiment as explained above, refresh can be executed sequentially on blocks, whose maximum number of failure bits has increased to a certain value, by repeating the execution of the verification processing in FIG. 23 while the semiconductor storage apparatus 100D is in operation (active).

(5) Embodiment 5

(5-1) Configuration of Semiconductor Storage Apparatus

Referring to FIG. 1, the reference numeral 100E represents a semiconductor storage apparatus 100E according to Embodiment 5 as a whole. This semiconductor storage apparatus 100E is the same as Embodiment 4 in such as manner that verification is executed on all the blocks in the installed flash memories; and the semiconductor storage apparatus 100E is configured in the same manner as the semiconductor storage apparatus 100D according to Embodiment 4, except that the failure bit number distribution is obtained when verification is performed and that a refresh period for each block is determined based on the obtained failure bit number distribution.

(5-2) Verification Processing

Figure 24:
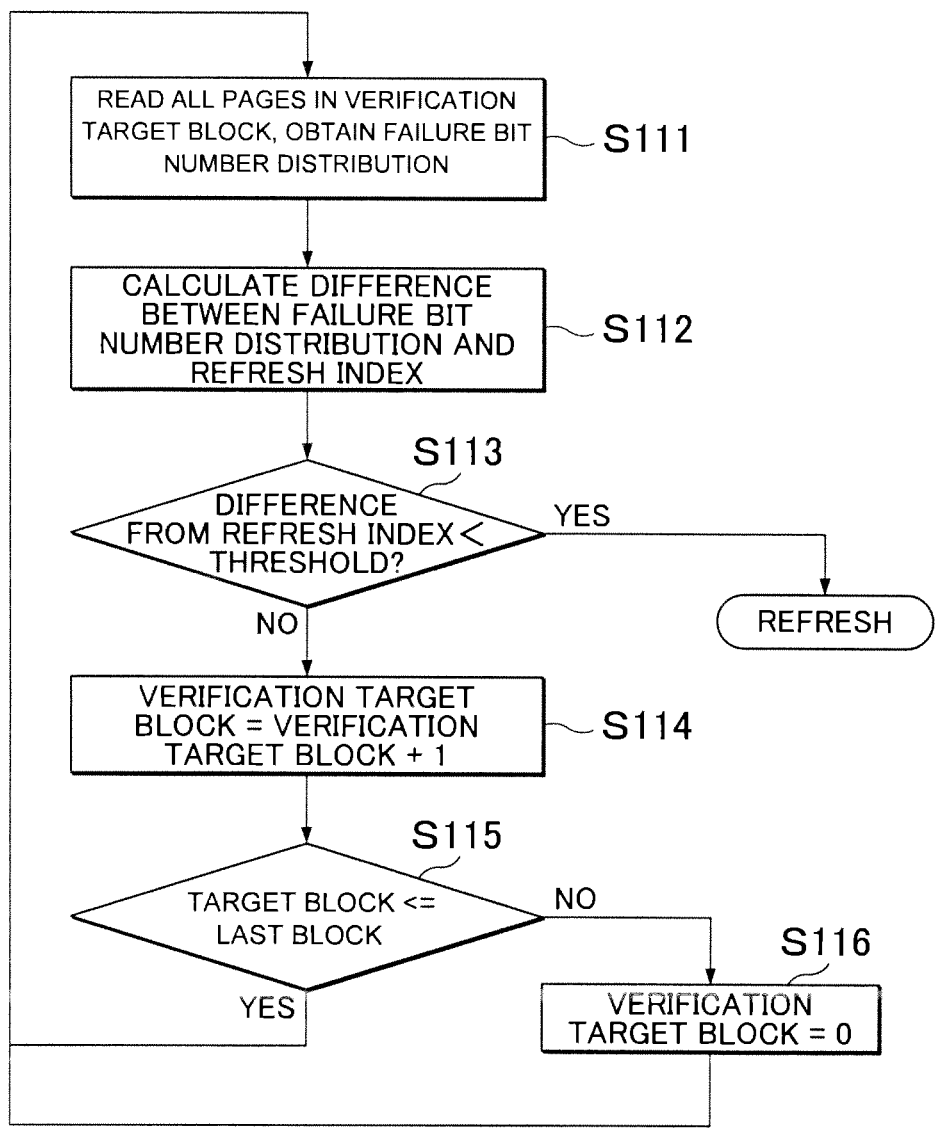
FIG. 24 is a flowchart of verification processing according to Embodiment 5.

FIG. 24 shows a processing sequence of verification processing executed by the processor 115E for the semiconductor storage apparatus 100E. The processor 115E starts this verification processing shown in FIG. 24 regularly or irregularly while the semiconductor storage apparatus 100E is in operation (active).

It should be noted that the processor 115E executes this verification processing at an executable speed on all the storage areas in the flash memories installed in the semiconductor storage apparatus 100E. This is the same as Embodiment 4.

The processor 115E firstly reads all the pages in a verification target block, also stores the number of failure bits per ECC/CW on each of the pages, which have been read, in the RAM 113, and obtains the failure bit number distribution in the verification target block based on the number of the failure bits per ECC/CW stored in the RAM 113 (S111).

Next, the processor 115E calculates the difference between the failure bit number distribution obtained in step S111 and failure bit number distribution which is prepared in advance for judging the necessity of refresh (hereinafter referred to as the refresh index) (S112).

The refresh index herein used means failure bit number distribution which is prepared in advance in order to judge the necessity of refresh as explained above, and is the failure bit number distribution in which the number of failure bits in the relevant block is associated with the number of ECC/CWs, for example, the number of ECC/CWs is 120 where the number of failure bits in the block is 0, and the number of ECC/CWs is 200 where the number of failure bits is 1. If the failure bit number distribution obtained in step S111 described above is similar to this refresh index, specifically speaking, if an absolute value of the difference between the failure bit number distribution obtained in step S111 and the refresh index is small, it is determined that reliability cannot be maintained and, therefore, refresh is required. It should be noted that the method of calculating the absolute value in this step is similar to the processing for determining the degree of deterioration in FIG. 17, and is similar to the processing for comparing the failure bit number distribution 1000 of the verification target block with the failure bit number distribution indexes 1001 and 1002.

The processor 115E judges whether the difference calculated in step S112 between the failure bit number distribution and the refresh index is smaller than a threshold specified in advance or not (S113).

If an affirmative judgment is returned in this step, the processor 115E determines that the failure bits in the verification target block occurred in distribution similar to the refresh index; and then executes refresh on this verification target block.

On the other hand, if a negative judgment is returned in step S113, the processor 115E determines that the failure bits in the verification target block occurred in distribution different from the refresh index and, therefore, it is not necessary to execute refresh at that time on this verification target block. Subsequently, the processor 115E proceeds to step S114 in order to make the next block a verification target block.

Since the processing in steps from S114 to S116 is the same as the processing in steps from S103 to S105 in FIG. 23, an explanation about it has been omitted. The processor 115E repeats the above-mentioned processing regularly.

(5-3) Effects of Embodiment 5

According to this embodiment as explained above, refresh can be executed sequentially on the blocks, whose failure bit number distribution is similar to the refresh index, by repeating the execution of the verification processing in FIG. 24 while the semiconductor storage apparatus 100E is in operation (active).

INDUSTRIAL APPLICABILITY

The present invention can be applied to a wide range of semiconductor storage apparatuses with various configurations in which flash memories are installed as storage media.

REFERENCE SIGNS LIST 100A to 100E Semiconductor storage apparatuses
110 Flash memory controller
115 Processor
117 Flash memory interface
120 to 128 Flash memories
201 Block
301 Page
402 ECC additional code
500 Data retaining period management information
600 Reliability maintained period table
700 Refresh management information 800 Verification management information
900 Number-of-failure-bits threshold table
1000 Failure bit number distribution
1001 and 1002 Failure bit number distribution indexes
1100 Management screen
1200 Reliability rank management information

The invention claimed is:

1. A semiconductor storage device comprising:
flash memory chips configured to provide a storage area to an external device; and
a memory controller configured to control reading or writing data from or to the flash memory chips,
wherein the memory controller is configured to manage the storage area based on correspondence of logical address and physical address of a plurality of blocks provided by the flash memory chips, and
wherein the memory controller is configured to manage information related to a degree of deterioration and read frequency on a basis of each block of the plurality of blocks,
wherein the memory controller is configured to register a refresh execution schedule for each block of the plurality of blocks based on the information related to the degree of deterioration and read frequency of the blocks, in a write process of new data to each block of the plurality of blocks,
wherein the memory controller is configured to adjust the refresh execution schedule for a certain block of the plurality of blocks by referring to the information related to read frequency of the certain block, in a read process of the certain block,
wherein the memory controller is configured to execute a refresh process for the plurality of the blocks based on the refresh execution schedule,
wherein the memory controller is configured to manage a plurality of options of a reliability maintained period calculated by degree of deterioration and read frequency of a target block, and
wherein the memory controller is configured to select one of the plurality of options of the reliability maintained period for each block, upon registering the refresh execution schedule for each block of the plurality of blocks based on the information related to the degree of deterioration and read frequency of the blocks, in a write process of new data to each block of the plurality of blocks.

2. The semiconductor storage device according to claim 1, wherein each of the plurality of options of the reliability maintained period indicates that data can be stored in the target block while maintaining high reliability.

3. The semiconductor storage device according to claim 2, wherein each of the plurality of options of the reliability maintained period depends on a type and characteristics of the flash memory chips.

4. The semiconductor storage device according to claim 1, wherein, upon a write process, the memory controller is configured to calculate the refresh execution schedule by the selected option of the reliability maintained period of data and current time.

5. The semiconductor storage device according to claim 1, wherein, upon a read process, the memory controller is configured to select new option of the plurality of options of the reliability maintained period, if an amount of change of the read frequency of the certain block exceeds a threshold, and
wherein the memory controller is configured to adjust the refresh execution schedule by the selected option of the plurality of options of the reliability maintained period and current time.

6. The semiconductor storage device according to claim 1, wherein when an external device sends an access request during the refresh process for at least one of the plurality of blocks, the memory controller is configured to prioritize processing the access request and temporarily stop the refresh process.

7. The semiconductor storage device according to claim 1, wherein the memory controller is configured to manage the plurality of options of the reliability maintained period in accordance with a single-level cell, multi-level cell, or triple-level cell flash memory chip type.

8. The semiconductor storage device according to claim 1, wherein the memory controller is configured to execute a write process and a read process to a part of the plurality of blocks as a test and to confirm accuracy of the plurality of options of the reliability maintained period.

* * * * *